US011913982B2

United States Patent
Oishi et al.

(10) Patent No.: US 11,913,982 B2
(45) Date of Patent: Feb. 27, 2024

(54) PROGRAM STORAGE MEDIUM, METHOD, AND INFORMATION PROCESSING DEVICE FOR RADIATED ELECTROMAGNETIC WAVE ESTIMATION

(71) Applicant: FUJITSU LIMITED, Kawasaki (JP)

(72) Inventors: Yusuke Oishi, Yokohama (JP); Shohei Yamane, Kawasaki (JP); Yoichi Kochibe, Mihama (JP); Hiroaki Watanabe, Chiba (JP); Toshiyasu Ohara, Nakano (JP)

(73) Assignee: FUJITSU LIMITED, Kawasaki (JP)

( * ) Notice: Subject to any disclaimer, the term of this patent is extended or adjusted under 35 U.S.C. 154(b) by 359 days.

(21) Appl. No.: 17/180,956

(22) Filed: Feb. 22, 2021

(65) Prior Publication Data

US 2021/0293870 A1    Sep. 23, 2021

(30) Foreign Application Priority Data

Mar. 17, 2020 (JP) .................................. 2020-046263

(51) Int. Cl.
*G01R 31/00* (2006.01)
*G06F 30/30* (2020.01)
*G06F 30/32* (2020.01)

(52) U.S. Cl.
CPC ............ *G01R 31/002* (2013.01); *G06F 30/30* (2020.01); *G06F 30/32* (2020.01)

(58) Field of Classification Search
CPC .................................. G01N 33/24; G01V 3/38
See application file for complete search history.

(56) References Cited

U.S. PATENT DOCUMENTS

| | | | | |
|---|---|---|---|---|
| 5,650,935 A | * | 7/1997 | Nishino | G06F 30/23 702/57 |
| 10,909,302 B1 | * | 2/2021 | Ginetti | G06F 30/367 |
| 2006/0173662 A1 | * | 8/2006 | Kazama | G06F 30/367 703/4 |
| 2012/0327624 A1 | * | 12/2012 | Tyhach | H01L 27/0605 361/782 |

FOREIGN PATENT DOCUMENTS

| | | |
|---|---|---|
| JP | 2001-165974 | 6/2001 |
| JP | 2001-343411 A | 12/2001 |
| JP | 2009-64096 A | 3/2009 |

OTHER PUBLICATIONS

Shim, Model for Estimating Radiated Emissions From a Printed Circuit Board With Attached Cables Due to Voltage-Driven Sources, IEEE Transactions on Electromagnetic Compatibility, vol. 47, No. 4, Nov. 2005 (Year: 2005).*
JPOA—Office Action of Japanese Patent Application No. 2020-046263 dated Oct. 3, 2023 with English Translation.

* cited by examiner

*Primary Examiner* — Michael J Dalbo
(74) *Attorney, Agent, or Firm* — Fujitsu Intellectual Property Center

(57) ABSTRACT

A radiated electromagnetic wave estimation is performed by a computer. The estimation process includes: converting a circuit diagram of an electronic circuit board into a combination of a plurality of partial circuits; and predicting radiated electromagnetic waves from the electronic circuit board by using a prediction result of a radiated electromagnetic wave for each of the partial circuits obtained by the converting.

4 Claims, 33 Drawing Sheets

FIG. 23

| NUMBER OF TIMES OF BENDING | NUMBER OF BENDING PATTERNS | NUMBER OF LINE LENGTH PATTERNS | NUMBER OF PATTERNS |
|---|---|---|---|
| 0 | 1 | $3^1=3$ | 3 |
| 1 | 1 | $3^2=9$ | 9 |
| 2 | 2 | $3^3=27$ | 54 |
| 3 | 3 | $3^4=81$ | 243 |
| 4 | 6 | $3^5=243$ | 1,458 |
| 5 | 10 | $3^6=729$ | 7,290 |

PROGRAM STORAGE MEDIUM, METHOD, AND INFORMATION PROCESSING DEVICE FOR RADIATED ELECTROMAGNETIC WAVE ESTIMATION

CROSS-REFERENCE TO RELATED APPLICATION

This application is based upon and claims the benefit of priority of the prior Japanese Patent Application No. 2020-46263, filed on Mar. 17, 2020, the entire contents of which are incorporated herein by reference.

FIELD

The embodiments discussed herein are related to a program storage medium, a method, and an information processing device for radiated electromagnetic wave estimation.

BACKGROUND

When current flows in an electronic circuit, electromagnetic waves are radiated. A regulated value (10 meters (m) away) is set for radiated electromagnetic waves (EMI) at each frequency, and a circuit needs to be designed to regulate the radiated electromagnetic waves within the regulated value. EMI stands for electromagnetic interference.

In recent years, a far field of radiated electromagnetic waves has been estimated by using machine-learning technology such as deep learning (DL). This far field refers to a region of electromagnetic waves, radiated from a target circuit, far (at a predetermined distance) from the target circuit, and is assumed to include a condition of the electromagnetic waves. The predetermined distance is, for example, 10 m.

For example, in an estimation method using the DL, a far field of electromagnetic waves based on a practical circuit is estimated by using a learning model generated from training data in which a training circuit and a result of a simulation of electromagnetic wave analysis on the circuit are paired. This circuit means a circuit over an image obtained by rendering the circuit into an image.

Japanese Laid-open Patent Publication No. 2009-64096 is an example of related art.

SUMMARY

According to an aspect of the embodiments, a radiated electromagnetic wave estimation method includes: converting a circuit diagram of an electronic circuit board into a combination of a plurality of partial circuits; and predicting radiated electromagnetic waves from the electronic circuit board by using a radiated electromagnetic wave prediction result for each of the partial circuits obtained by the converting.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 23 is a diagram exemplifying the number of patterns of training data based on a circuit configuration;

DESCRIPTION OF EMBODIMENTS

Figure 1:
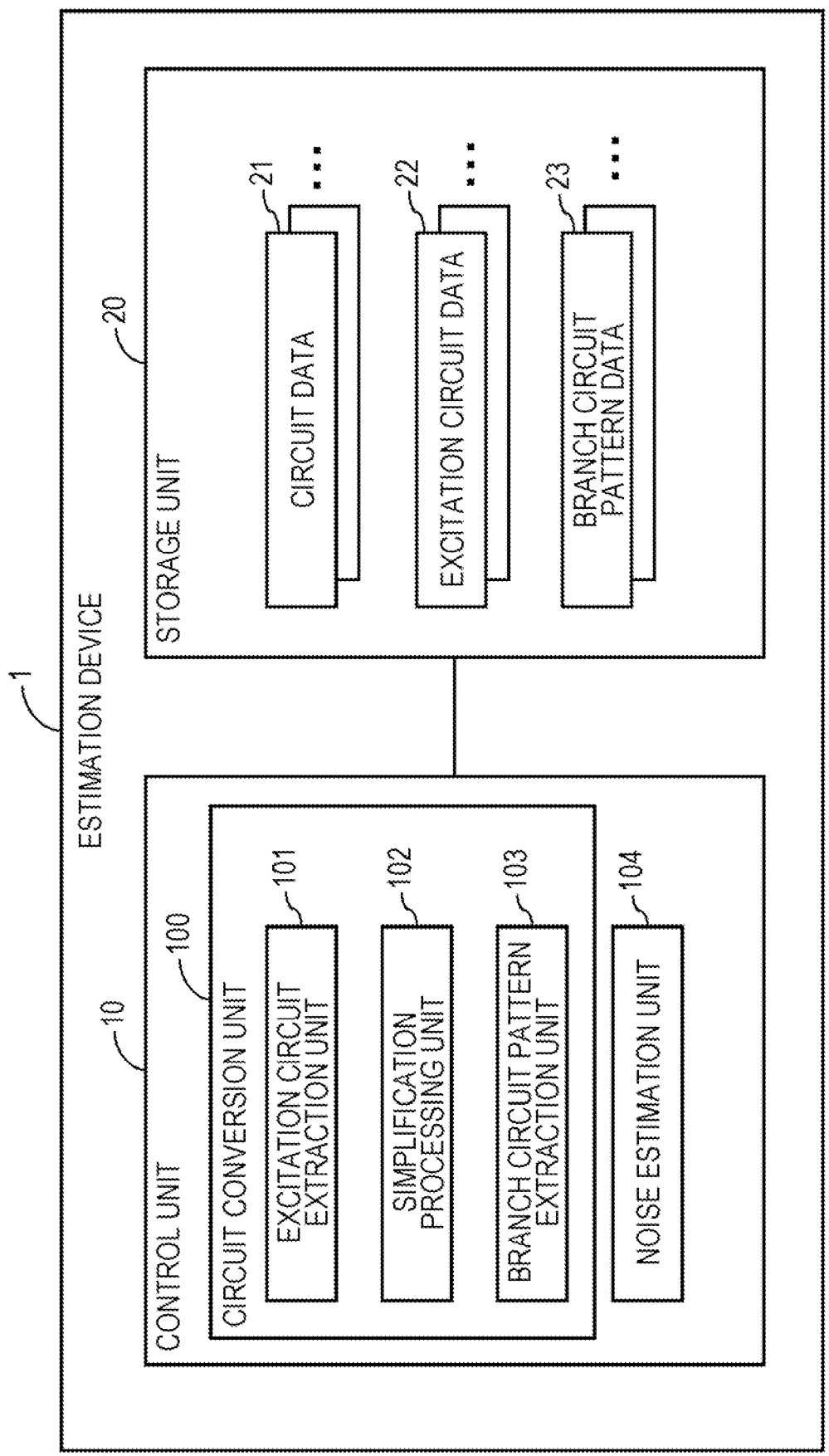
FIG. 1 is a functional block diagram exemplifying a configuration of an estimation device as an example of an embodiment.

Estimation for a complex practical circuit requires a huge number of training circuits.

To implement the estimation for a complex electronic circuit, machine learning needs to be performed with a huge number of training circuits prepared. For example, an electromagnetic wave prediction method according to related art involves a problem in that a processing cost increases with complexity of the analysis target circuit.

An object of one aspect is to reduce the prediction processing cost for the electromagnetic wave prediction on an electronic circuit board.

Hereinafter, an embodiment of the present radiated electromagnetic wave estimation program, information processing device, and radiated electromagnetic wave estimation method will be described with reference to the drawings. The following embodiment, however, is merely an example and does not intend to exclude application of various modification examples and techniques that are not explicitly described in the embodiment. For example, the present embodiment may be variously modified and implemented without departing from the spirit thereof. The drawings do not indicate that only constituent components illustrated in the drawings are provided. The drawings indicate that other functions and the like may be included.

(A) Configuration

FIG. 1 is a functional block diagram exemplifying a configuration of an estimation device 1 as an example of an embodiment. The estimation device 1 exemplified in FIG. 1 estimates electromagnetic waves (radiated electromagnetic waves: electromagnetic interference (EMI)) radiated from n electronic circuit board.

The estimation device 1 exemplified in FIG. 1 includes a control unit and a storage unit 20.

The control unit 10 corresponds to an electronic circuit such as a central processing unit (CPU). The control unit 10 has an internal memory for storing a program defining various processing procedures and control data, and using these, executes various types of processing. The control unit 10 includes a circuit conversion unit 100 and a noise estimation unit 104.

The storage unit 20 is a semiconductor memory device such as a random-access memory (RAM) or a flash memory, or a storage device such as a hard disk or an optical disk, for example. The storage unit 20 includes circuit data 21, excitation circuit data 22, and branch circuit pattern data 23.

The circuit data 21 is data used to generate a pattern image of a circuit. The circuit data 21 may include circuit data for teacher data used to generate a learning model, and target circuit data. The circuit data 21 may be, for example, data in which each element included in the circuit is associated with a position at which the element is disposed over the image, information on coupling between the element and another element, and the like. The circuit data 21 is stored in the storage unit 20 for each circuit. The circuit data 21 may include a pattern image (circuit pattern image) of a circuit obtained by rendering the circuit data 21.

The storage unit 20 may store data (simulation result data) on a result of a simulation in electromagnetic wave analysis on the circuit data 21 for teacher data. The simulation result data may be far field data as a result of executing a simulation with the circuit data being an input of the simulation in the electromagnetic wave analysis.

The storage unit 20 may store far field data, which is data in a case where the circuit data 21 as the analysis target is applied to the learning model. The far field data indicates the intensity of the electromagnetic waves radiated from the target circuit at each frequency in a region far (predetermined distance) away. The simulation result data is data on a result of a simulation in the electromagnetic wave analysis on the circuit data 21 for teacher data.

The circuit conversion unit 100 converts a circuit diagram of the electronic circuit board into a combination of branch circuit patterns that are a plurality of partial circuits. The circuit means a circuit over an image obtained by rendering the circuit into the image.

As illustrated in FIG. 1, the circuit conversion unit 100 has functions as an excitation circuit extraction unit 101, a simplification processing unit 102, and a branch circuit pattern extraction unit 103.

The excitation circuit extraction unit 101 extracts an excitation circuit that is a circuit (partial circuit) coupled to an excitation source, from an analysis target circuit based on the circuit data 21 on the analysis target circuit.

The circuit data 21 may be, for example, data in which each element included in the circuit is associated with a position at which the element is disposed over the image, information on coupling between the element and another element, and the like. The circuit data 21 may be stored, for example, in a storage device 13 (see FIG. 33). The circuit data 21 may include a pattern image of a circuit obtained by rendering the circuit data 21.

The excitation source is, for example, an AC power supply and, in a circuit board, an electronic circuit directly coupled to a power supply pin (electrode) to which the AC power supply is coupled corresponds to an excitation circuit. Hereinafter, the power supply pin over the circuit board may be referred to as an excitation source.

Figure 2:
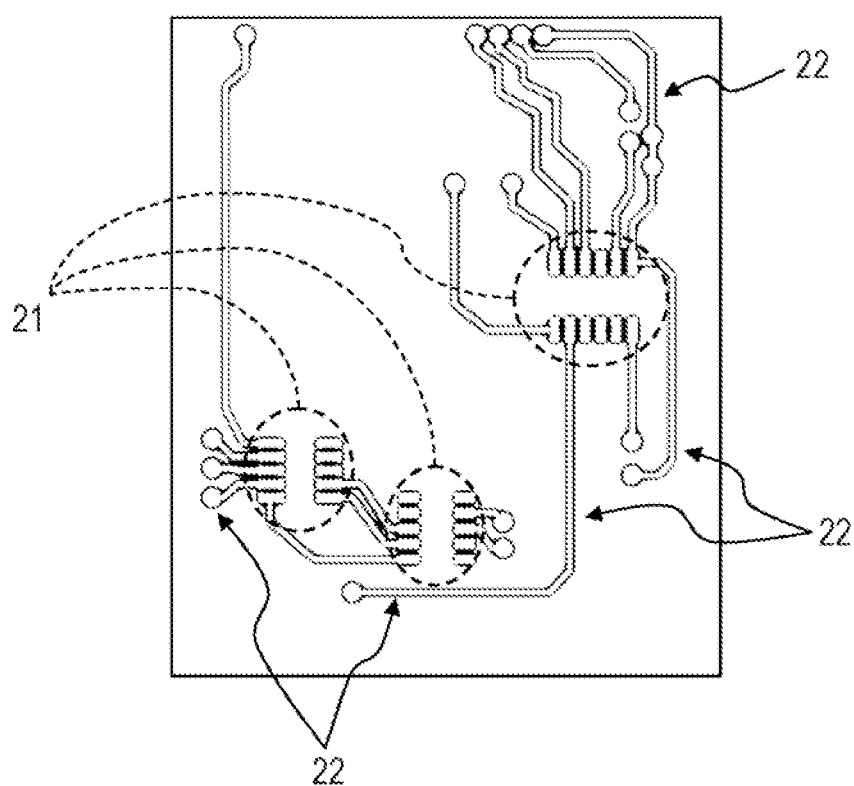
FIG. 2 is a diagram illustrating an excitation circuit.

FIG. 2 is a diagram illustrating an excitation circuit.

Over the circuit board exemplified in FIG. 2, a plurality of circuits (excitation circuits) 22 coupled to a plurality of rectangular power supply pins 21 are formed.

In an EMI inspection, an investigation is performed with an excitation power supply input to a circuit, causing massive current to flow in the circuit coupled to the power supply (power supply pin), resulting in the circuit serving as a noise source outputting (radiating) electromagnetic noise.

In view of this, the excitation circuit extraction unit 101 of the present estimation device 1 extracts only the excitation circuit 22 coupled to the excitation source (power supply pin 21) in the electronic circuit (circuit diagram, analysis target electronic circuit) formed over the analysis target electronic circuit board.

Figure 33:
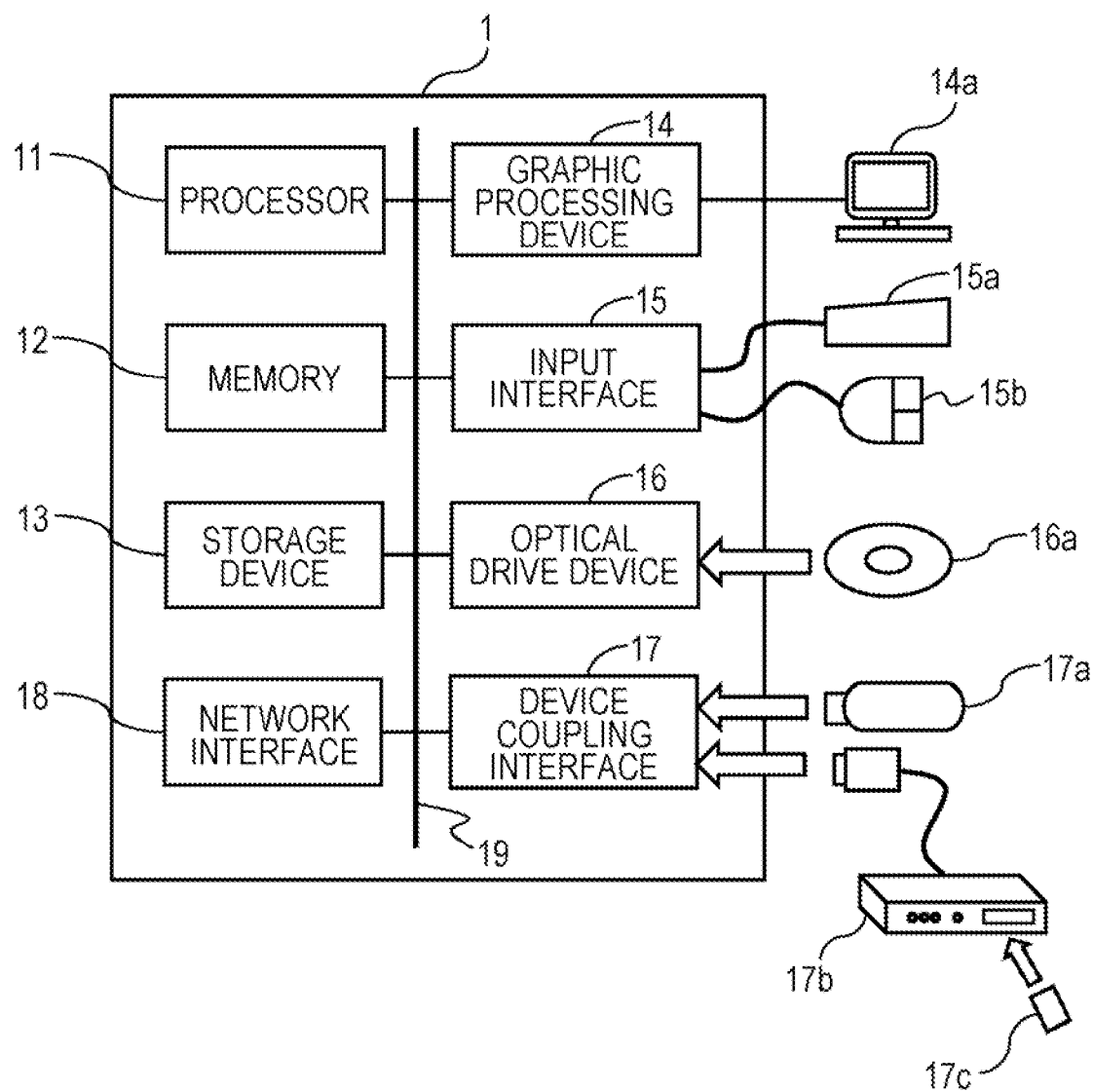
FIG. 33 is a diagram exemplifying a hardware configuration of the estimation device as an example of the embodiment.

For example, an operator of the present estimation device 1 may perform input for designating an excitation source over the circuit board by using a keyboard 15a or a mouse 15b (see FIG. 33). Then, the excitation circuit extraction unit 101 extracts a circuit directly coupled to the excitation source thus designated, as the excitation circuit.

Figure 3:
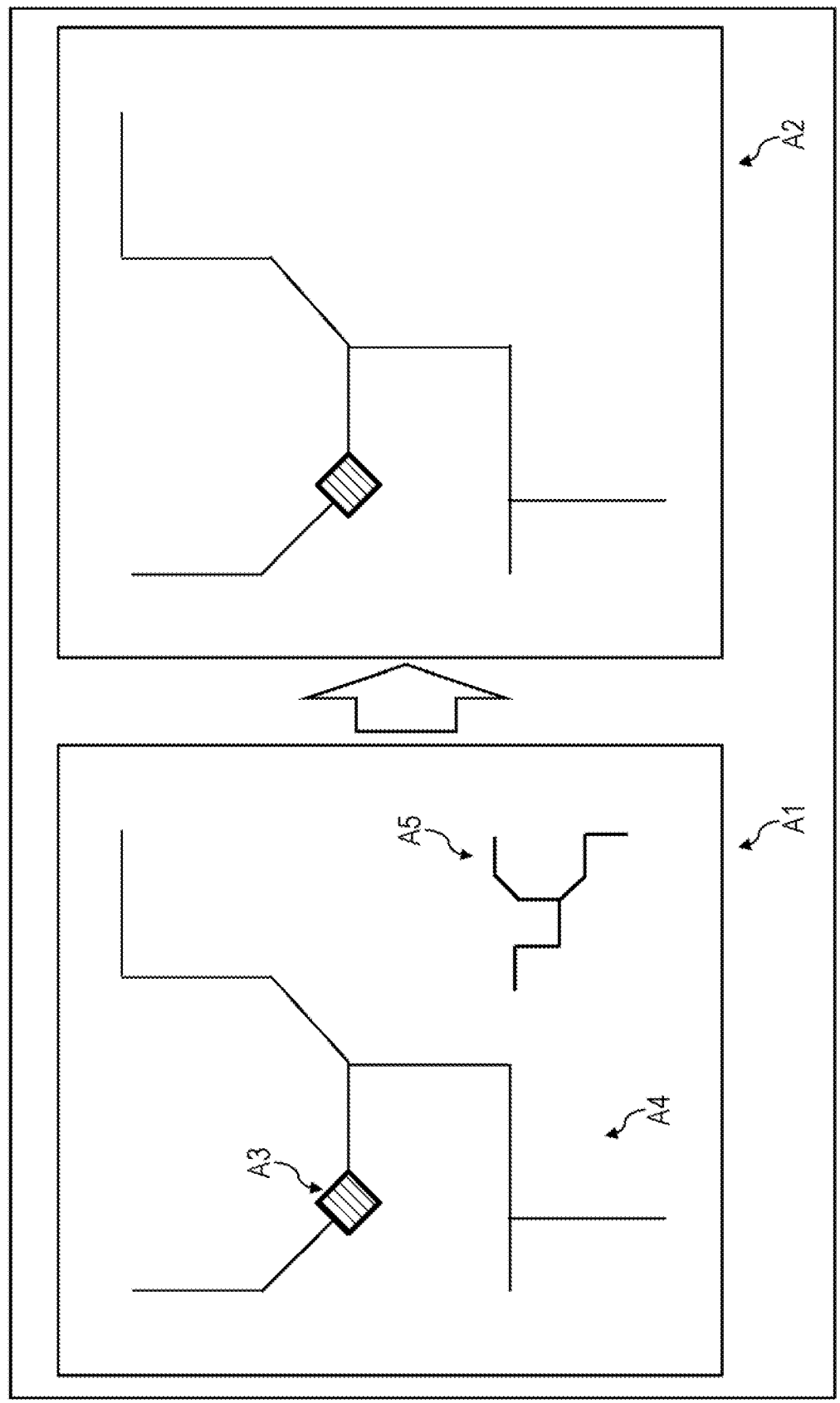
FIG. 3 is a diagram illustrating processing executed by an excitation circuit extraction unit of the estimation device as an example of the embodiment.

FIG. 3 is a diagram illustrating processing executed by the excitation circuit extraction unit 101 of the estimation device 1 as an example of the embodiment.

In FIG. 3, reference symbol A1 denotes an example of a state before the extraction of the excitation circuit, and reference symbol A2 denotes an example of the extracted excitation circuit. Reference symbol A3 denotes an excitation source.

In the state denoted by reference symbol A1, a circuit denoted by reference symbol A4 is coupled to the excitation source, whereas a circuit denoted by reference symbol A5 is not coupled to the excitation source.

In this state denoted by reference symbol A1, the excitation circuit extraction unit 101 extracts only a circuit (excitation circuit) coupled to the excitation source (see reference symbol A2).

Information indicating the excitation circuit extracted by the excitation circuit extraction unit 101 is stored in a predetermined storage area of the storage unit 20, as the excitation circuit data 22.

The simplification processing unit 102 generates a simplified excitation circuit by simplifying the shape of the excitation circuit extracted by the excitation circuit extraction unit 101. The simplified excitation circuit is an excitation circuit whose shape is simplified.

The simplification processing unit 102 simplifies the shape of the excitation circuit extracted by the excitation circuit extraction unit 101, to extract an end point and a branch point in the excitation circuit. For example, the simplified excitation circuit is obtained by simplifying the shape of the excitation circuit, and has an end point and a branch point.

Figure 4:
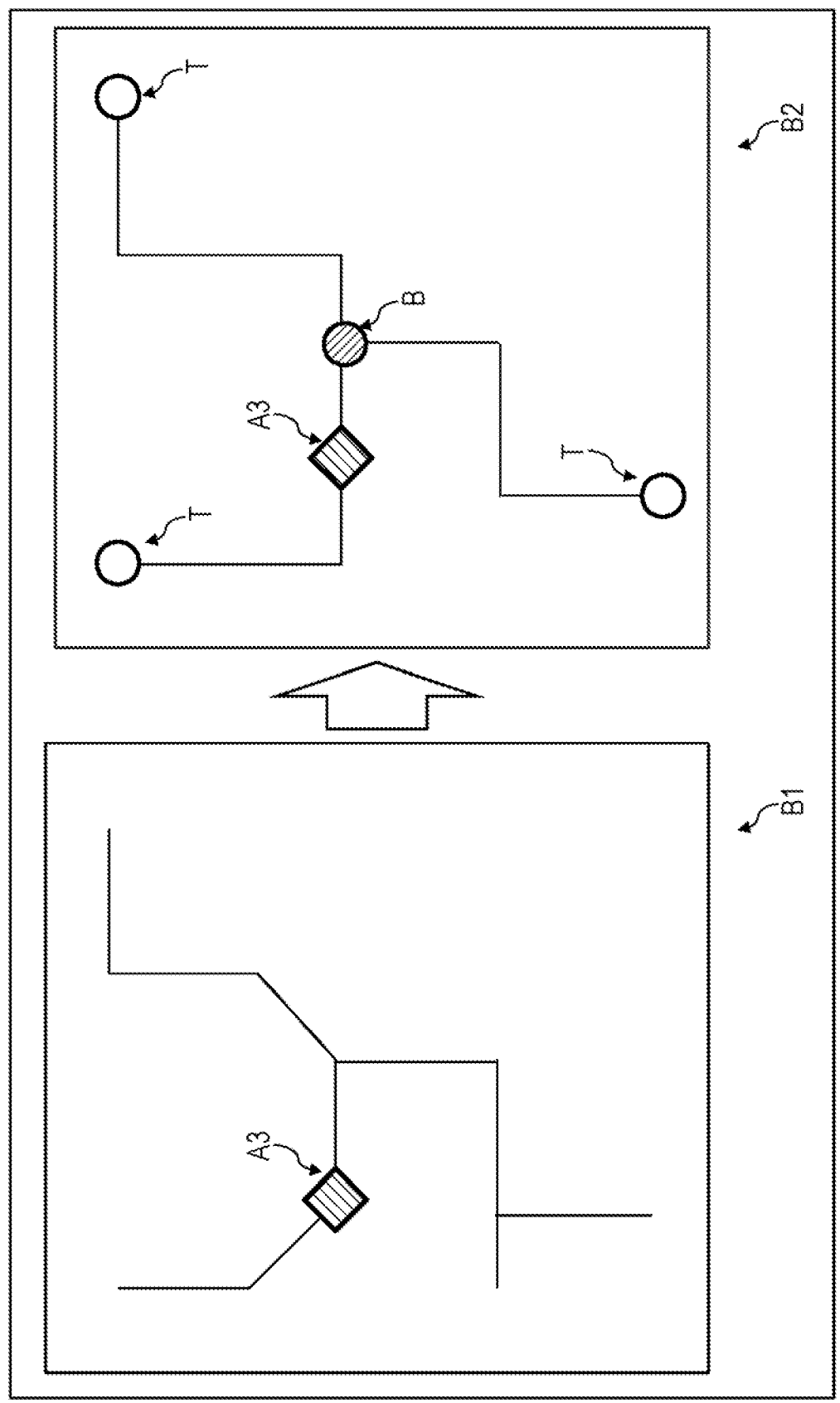
FIG. 4 is a diagram illustrating processing executed by a simplification processing unit of the estimation device as an example of the embodiment.

FIG. 4 is a diagram illustrating processing executed by the simplification processing unit 102 of the estimation device 1 as an example of the embodiment.

In the drawing, the same reference symbols as those used above denote the same parts, and a description thereof will be omitted.

In FIG. 4, reference symbol B1 indicates an excitation circuit, and reference symbol B2 indicates a simplified excitation circuit obtained by simplifying the excitation circuit indicated by reference symbol B1.

In the simplified excitation circuit denoted as an example by reference symbol B2 in FIG. 4, the circuit shape of the excitation circuit is simplified by being represented by two-component straight lines orthogonal to each other including a straight line in a vertical direction (vertical line) and a straight line in a lateral direction (horizontal line). In the simplified excitation circuit exemplified in FIG. 4, branch lines having a line length equal to or shorter than a predetermined threshold in the excitation circuit are omitted. End portions of the simplified excitation circuit denoted by reference symbol B2 in FIG. 4 are provided with white circles each representing an end point T and a black circle representing a branch point B.

The branch circuit pattern extraction unit 103 described later extracts a branch circuit pattern by using the simplified excitation circuit generated by the simplification processing unit 102.

Figure 5:
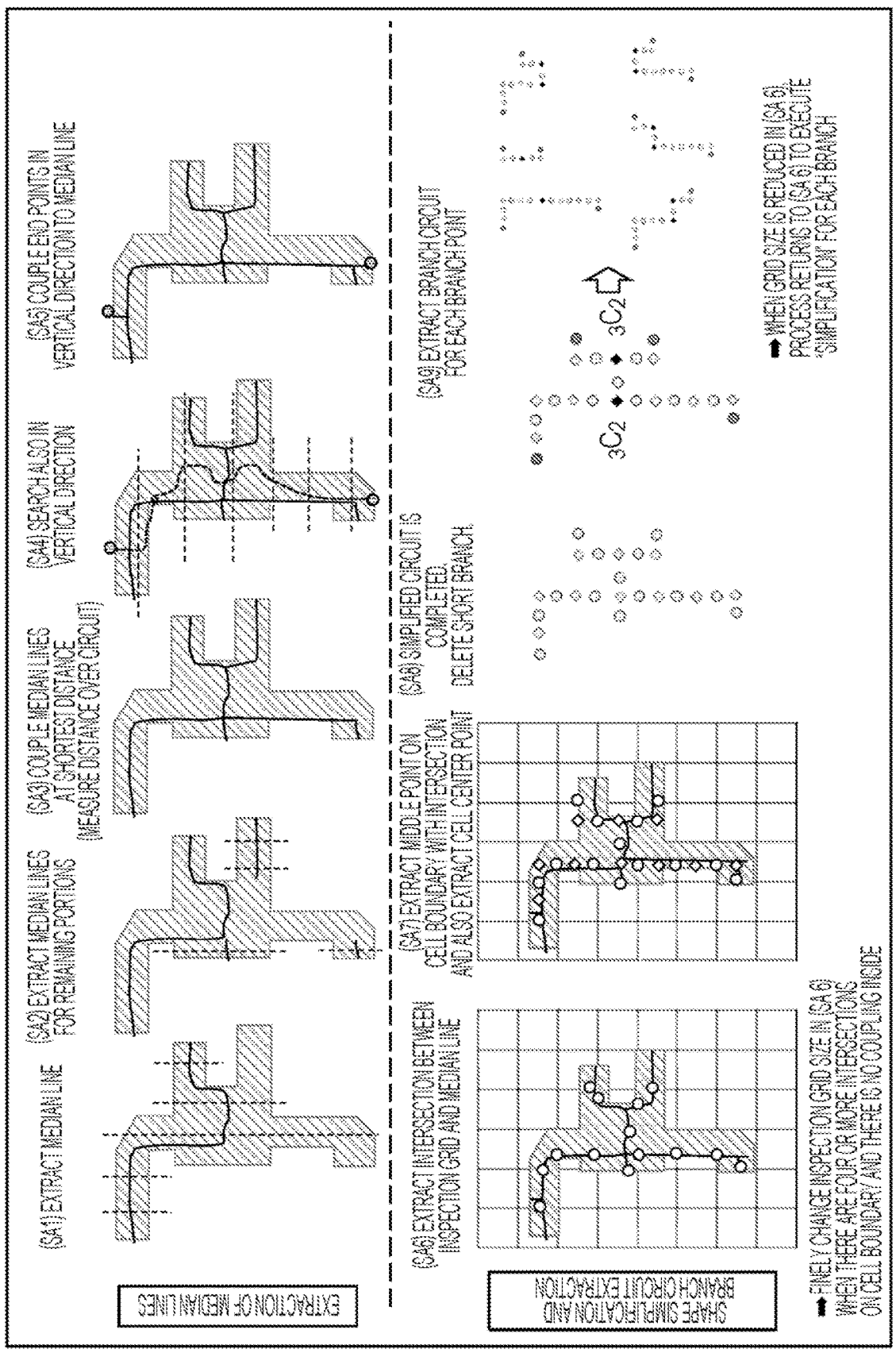
FIG. 5 is a diagram illustrating an overview of a method of generating a simplified excitation circuit and a branch circuit pattern, performed by the simplification processing unit of the estimation device as an example of the embodiment.

FIG. 5 is a diagram illustrating an overview of a method of generating a simplified excitation circuit and a branch circuit pattern, performed by the simplification processing unit 102 of the estimation device 1 as an example of the embodiment.

A method of generating a simplified excitation circuit performed by the simplification processing unit 102 will be described below with reference to FIG. 5.

First of all, the simplification processing unit 102 extracts the median line of a circuit portion of the excitation circuit. The median line of the circuit portion of the excitation circuit may be hereinafter simply referred to as the median line of the excitation circuit. The simplification processing unit 102 may extract the median line of the excitation circuit by using, for example, a Voronoi tessellation method.

For example, the simplification processing unit 102 scans the circuit portion, extracted from the excitation circuit, at a plurality of positions at a predetermined interval in a first direction (the vertical direction in the example illustrated in FIG. 5). The simplification processing unit 102 extracts middle points of the circuit width in the scanning direction at a plurality of positions along a second direction (the lateral direction in the example illustrated in FIG. 5) and couples the extracted middle points at the respective positions to generate (extract) the median line of the partial circuit (see step SA1 in FIG. 5). In FIG. 5, the scanning direction is indicated by broken lines.

Details of the method of extracting the median line of the excitation circuit performed by the simplification processing unit 102 will be described later with reference to a flowchart illustrated in FIG. 30.

The simplification processing unit 102 similarly extracts the median lines for the remaining circuit portions of the excitation circuit (see step SA2 in FIG. 5).

Figure 6:
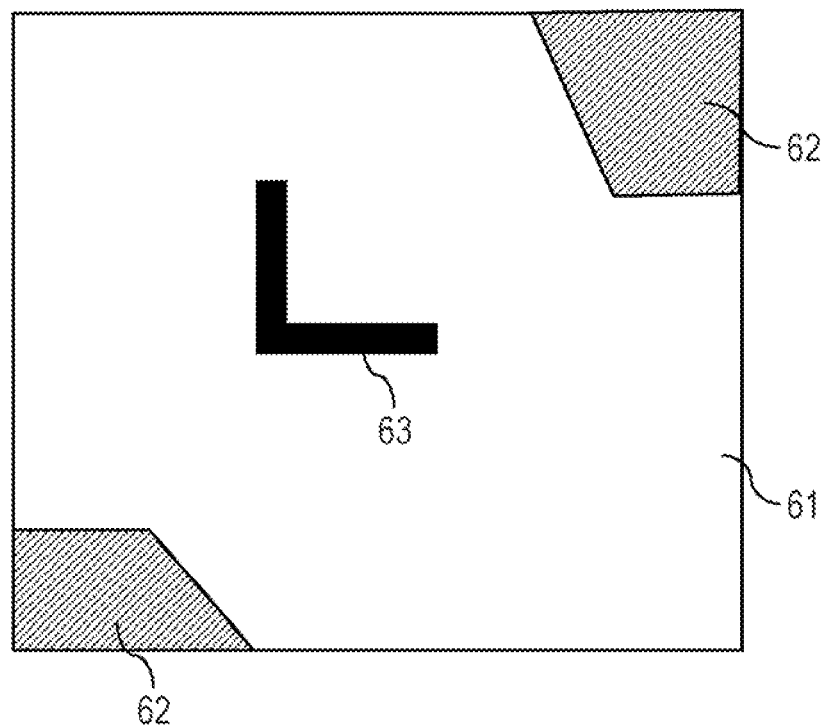
FIG. 6 is a diagram illustrating a method of measuring a distance over a circuit in the estimation device as an example of the embodiment.
Figure 7:
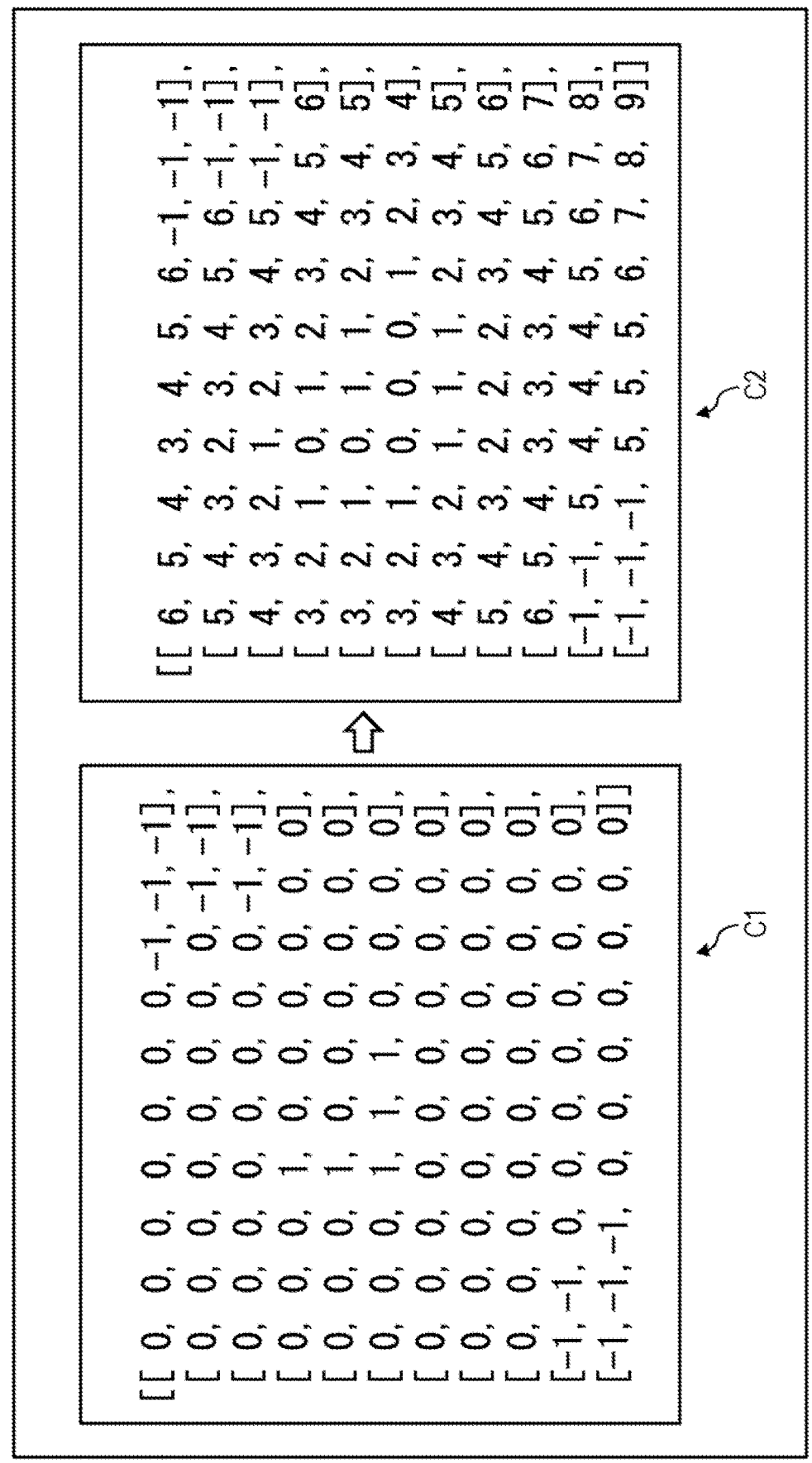
FIG. 7 is a diagram illustrating a method of measuring a distance over a circuit in the estimation device as an example of the embodiment.

Thereafter, the simplification processing unit 102 couples the extracted median lines to each other (see step SA3 in FIG. 5). The simplification processing unit 102 couples the median lines to each other at the shortest distance over the excitation circuit, FIGS. 6 and 7 are diagrams illustrating a method of measuring a distance over a circuit in the estimation device 1 as an example of the embodiment. FIG. 6 is a diagram exemplifying an excitation circuit, and illustrates a circuit portion 61, a dielectric body 62 outside the circuit portion, and a median line 63 of the circuit portion.

Reference symbol C1 in FIG. 7 denotes numerical values expressing the excitation circuit exemplified in FIG. 6, in which "0" represents a circuit portion, "−1" represents a dielectric body outside the circuit, and "1" represents the median line. Reference symbol C2 in FIG. 7 denotes positions expressed by the numerical values in reference symbol C1, using values indicating distances from the median line. Thus, the simplification processing unit 102 assigns a value that increases with the distance from the median line, to each position over the excitation circuit.

With such a method, the simplification processing unit 102 may easily express each point over the excitation circuit, using a distance from the median line.

Figure 8:
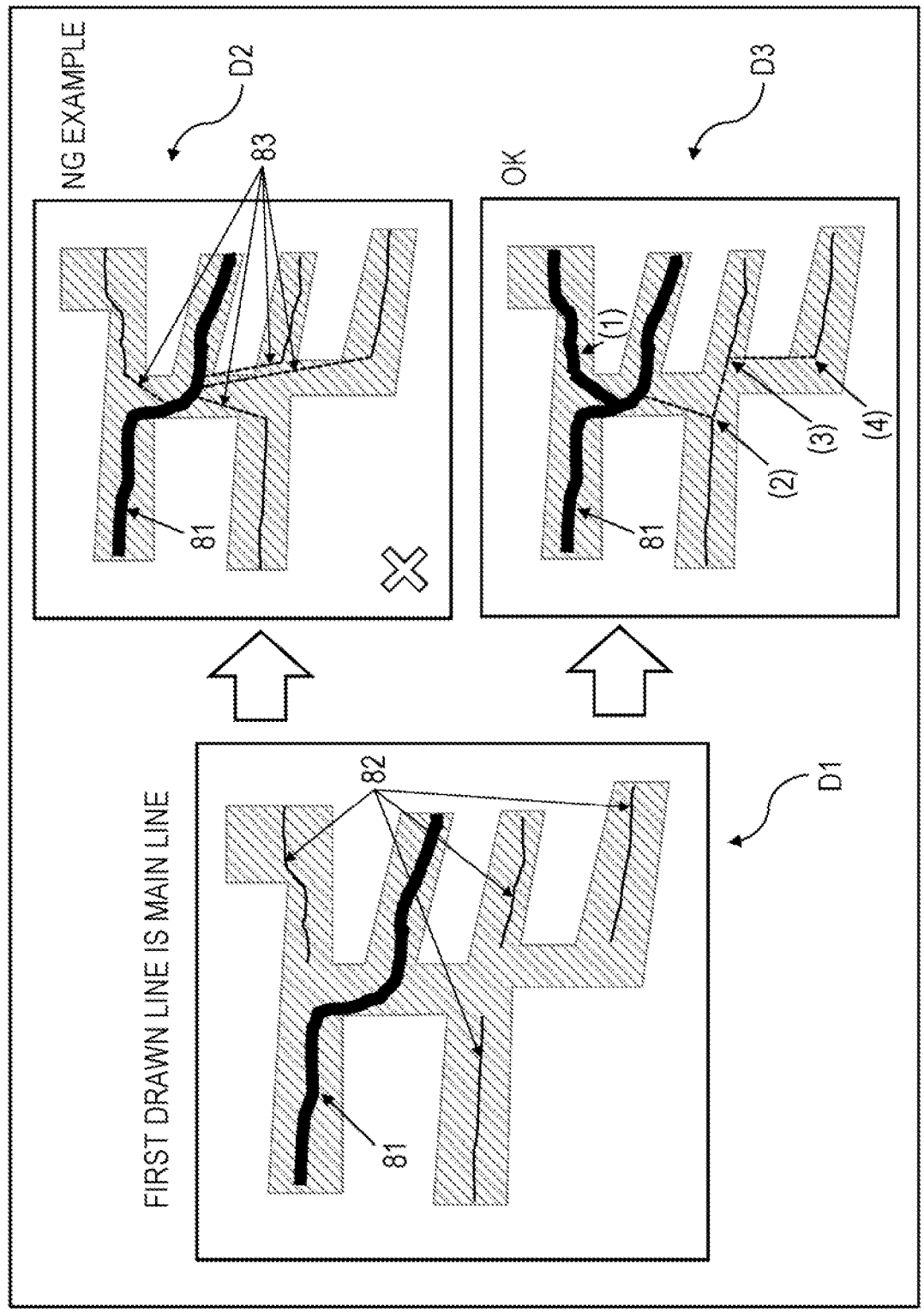
FIG. 8 is a diagram illustrating a method of coupling median lines performed by the simplification processing unit of the estimation device as an example of the embodiment.

FIG. 8 is a diagram illustrating a method of coupling the median lines performed by the simplification processing unit 102 of the estimation device 1 as an example of the embodiment.

The simplification processing unit 102 repeatedly performs the following processes a1 to a3 to couple the median lines.

Process a1: The simplification processing unit 102 selects as a main line 81 (see reference symbol D1 in FIG. 8), one median line (for example, the initially set median line) among the plurality of median lines set over the excitation circuit. The main line 81 may be randomly selected from among a plurality of median lines, or selected as a median line having the longest line length, and may be obtained through appropriate modifications. In FIG. 8, the main line 81 is illustrated with a bold line, and the median lines 82 other than the main line are illustrated with thin lines.

Process a2: The simplification processing unit 102 selects the median line 82 having an end point (coupling state point) at a position closest to the main line 81, and couples the end point and the median line to each other by a straight line. The straight line coupling the main line and the end point of the median line to each other may be referred to as a coupling straight line. In FIG. 8, coupling straight lines are illustrated with dotted lines 83 (see reference symbol D2).

Process a3: The simplification processing unit 102 makes the coupling straight lines 83 and the median lines 82, coupled to each other in the process a2, included in the main line 81.

For example, the simplification processing unit 102 couples (and combines) the plurality of median lines 82 to the main line 81 one by one, step by step. In an example denoted by reference symbol D3 in FIG. 8, coupling and combining of the median lines to the main line are performed in the order indicated by (1) to (4). Reference symbol D3 denotes a state in which the median line coupled to the main line in (1) is included in the main line.

In the example illustrated in FIG. 8, reference symbol D2 denotes an example of an undesirable (Not Good (NG)) method of coupling the median lines. In the example denoted by reference symbol D2, end points of a plurality of median lines are coupled to a main line at once instead of being coupled step by step.

Returning to the description with reference to FIG. 5, the simplification processing unit 102 scans the circuit portion extracted from the excitation circuit at a predetermined interval in the second direction (lateral direction (direction orthogonal to the first direction) in the example illustrated in FIG. 5), which is a direction different from that in step SA1. The simplification processing unit 102 extracts middle points of the circuit width in the scanning direction at a plurality of positions along the first direction (the vertical direction in the example illustrated in FIG. 5) and couples the extracted middle points at the respective positions to generate (extract) the median line of the partial circuit (see step SA4 in FIG. 5). In FIG. 5, the median line in the vertical direction generated in step SA4 is illustrated with a broken line.

Thereafter, the simplification processing unit 102 couples each of the upper end and the lower end of the median line in the vertical direction generated in step SA4 to the median line generated in step SA3 at the shortest distance (see step SA5 in FIG. 5). The median line (main line) of the excitation circuit thus generated represents a schematic shape of the excitation circuit.

Next, the simplification processing unit 102 projects the median line (main line) generated in step SA5 over a virtually provided inspection grid (lattice space) (see step SA6 in FIG. 5). For example, the simplification processing unit 102 projects the schematic shape (median line, main line) of the excitation circuit over the inspection grid.

In the inspection grid, square cells (squares) having a predetermined size (lattice interval) are arranged vertically and horizontally.

The simplification processing unit 102 extracts an intersection between the inspection grid and the median line, for example, an intersection over a cell boundary. In the example illustrated in step SA6 in FIG. 5, white circles represent intersections over the cell boundaries.

The simplification processing unit 102 subdivides the grid when there are four or more intersections with median lines over the boundary of one cell, and when there is an intersection between median lines inside the cell, for example, when two median lines are coupled to each other inside the cell.

Thus, when there are four intersections over the cell boundaries, the simplification processing unit 102 determines whether median lines come into contact with (are coupled to) each other inside this cell.

Figure 9:
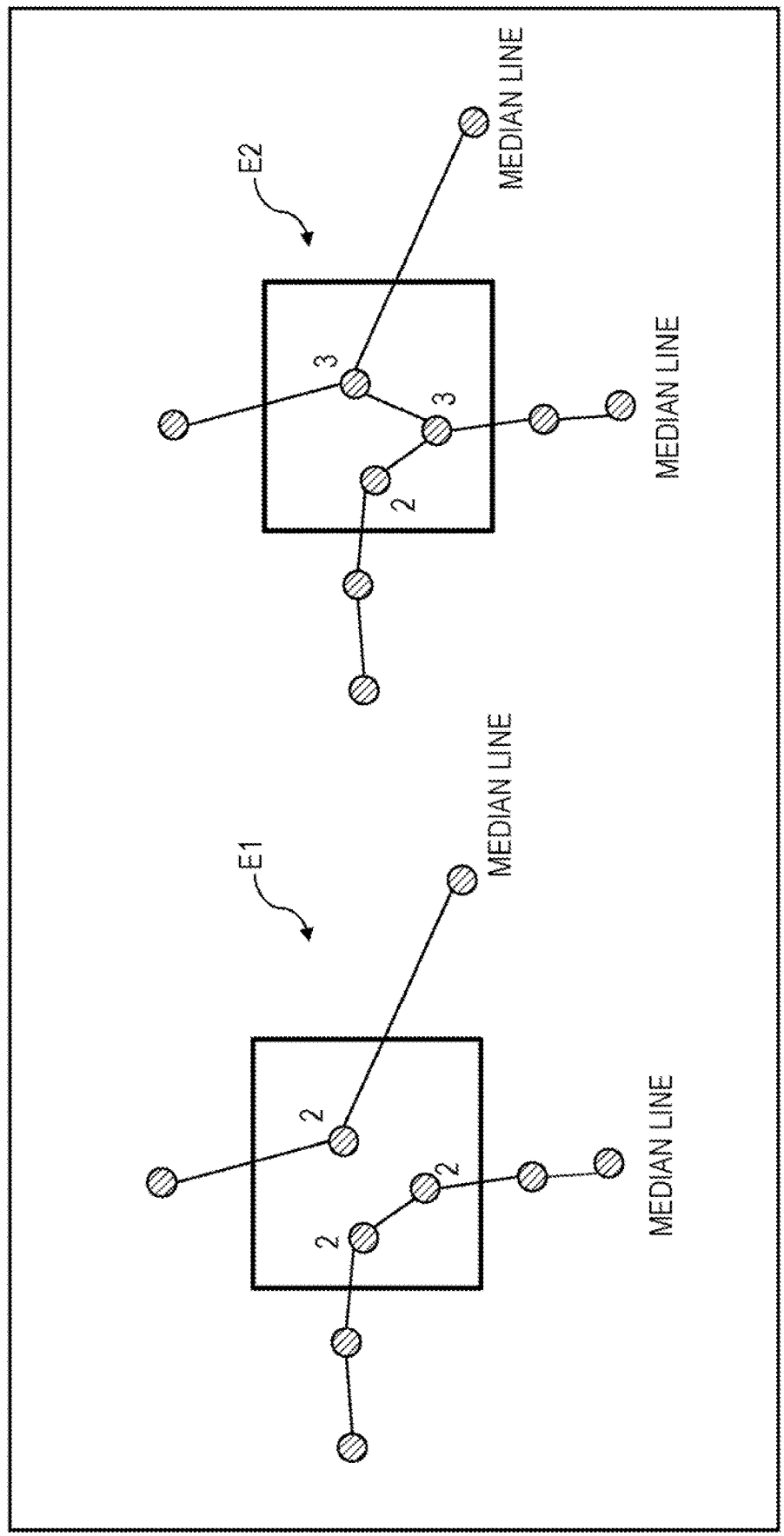
FIG. 9 is a diagram illustrating an example of grid subdivision determination processing executed by the simplification processing unit of the estimation device as an example of the embodiment.

FIG. 9 is a diagram illustrating an example of grid subdivision determination processing executed by the simplification processing unit 102 of the estimation device 1 as an example of the embodiment.

In the following example, the simplification processing unit 102 approximates the median line by coupling a plurality of straight lines to each other (multi-line approximation). A point coupling a plurality of straight lines to each other in the approximation may be referred to as a "median line forming point" or a "coupling point".

The simplification processing unit 102 counts, for a cell determined to have cell boundaries having four intersections, coupling points inside the cell. Hereinafter, the number of coupling points inside a cell is denoted by N. The simplification processing unit 102 obtains the total number of other coupling points to which each of the N coupling points inside the cell is coupled. Hereinafter, the total number of coupling points to which each of the N coupling points in a cell is coupled is referred to as a total coupled coupling point count and is denoted by reference symbol S.

For example, in an example denoted by reference symbol E1 in FIG. 9, a cell includes three coupling points (N=3). These three coupling points are each coupled to two other coupling points. Therefore, in the example denoted by reference symbol E1 in FIG. 9, the total coupled coupling point count S is 6 (=2+2+2).

On the other hand, in an example denoted by reference symbol E2 in FIG. 9, a cell includes three coupling points (N=3). One of these three coupling points is coupled to two other coupling points, and two coupling points are each coupled to three other coupling points. Therefore, in the example denoted by reference symbol E2 in FIG. 9, the total coupled coupling point count S is 8 (=2+3+3).

In a case where the total coupled coupling point count S is 2N+2, the simplification processing unit 102 determines that the cell includes an intersection of median lines, for example, determines that the median lines are coupled to each other, as denoted as an example by reference symbol E2 in FIG. 9.

In a case where the total coupled coupling point count S is 2N, the simplification processing unit 102 determines that the cell includes a plurality of median lines not coupled to each other as denoted as an example by reference symbol E1 in FIG. 9. In this case, the simplification processing unit 102 doubles the resolution of the inspection grid. For example, subdivision is performed by halving the grid interval of the currently applied inspection grid. Coupled/not coupled information is maintained.

Next, the simplification processing unit 102 extracts a middle point over the cell boundary line with an intersection and also extracts a cell center point, in the inspection grid over which the median lines are projected (see step SA7 in FIG. 5).

The middle point over the cell boundary line with an intersection is a middle point over a boundary line (side) of a cell intersecting with a median line, in a case where the median line intersects with the cell boundary line.

In the example illustrated in step SA7 in FIG. 5, a white rectangle (diamond) represents the center point of a cell, and a white circle represents the middle point of a cell boundary line (side).

The simplification processing unit 102 generates a simplified excitation circuit by coupling these points that are the center points of the cells and the middle points over the cell boundary lines to each other. For example, the simplification processing unit 102 generates the simplified excitation circuit by projecting the schematic shape of the excitation circuit over an inspection grid with a plurality of squared cells arranged, and coupling points (the middle points over the cell boundary lines and the center points of the cells), extracted based on the intersections between the schematic shape and the square cells, to each other.

In this manner, a simplified excitation circuit is generated using the center points and the middle points extracted in step SA7. For example, the simplified excitation circuit is generated by the simplification processing unit 102 (see step SA8 in FIG. 5). The middle points over the cell boundary lines and the cell center points forming the simplified excitation circuit may be referred to as constituent components of the simplified excitation circuit. The simplified excitation circuit is expressed by coupling constituent components of the simplified excitation circuit to each other.

When a line segment (branch) included in the simplified excitation circuit is shorter than a preset threshold, the simplification processing unit 102 may delete the branch to further simplify the simplified excitation circuit.

The information configuring the simplified excitation circuit generated by the simplification processing unit 102 may be stored in a predetermined storage area such as a memory 12 (see FIG. 33) or the storage device 13. Thus, the simplified excitation circuit generated by the simplification processing unit 102 may be transferred to the branch circuit pattern extraction unit 103.

The branch circuit pattern extraction unit 103 extracts a branch circuit pattern from the simplified excitation circuit generated by the simplification processing unit 102. The branch circuit pattern extraction unit 103 extracts a branch circuit pattern to be simulated by the noise estimation unit 104 on the subsequent stage based on the partial circuit extracted by the simplification processing unit 102.

Figure 10:
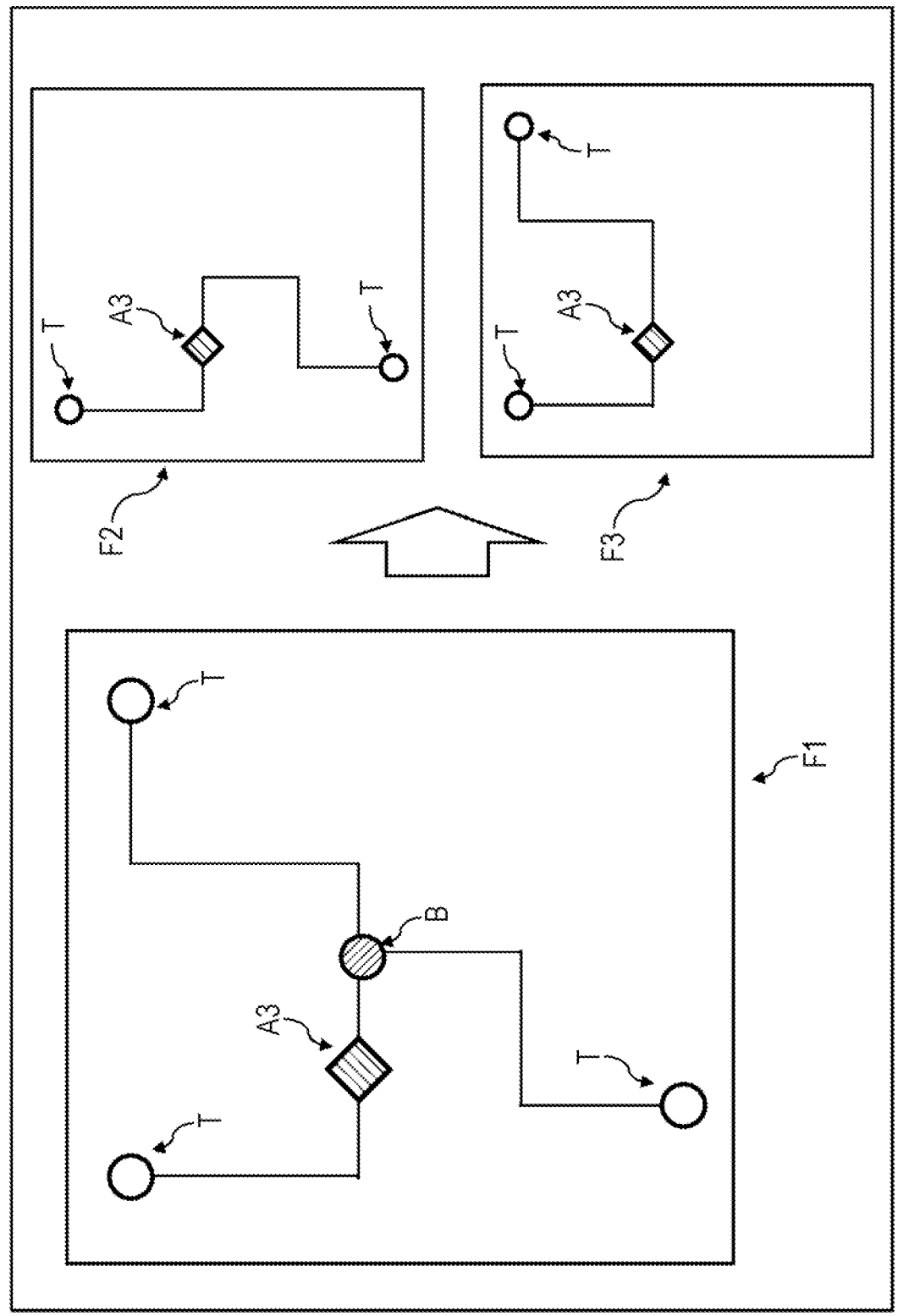
FIG. 10 is a diagram illustrating an overview of processing executed by a branch circuit pattern extraction unit of the estimation device as an example of the embodiment.

FIG. 10 is a diagram illustrating an overview of processing executed by the branch circuit pattern extraction unit 103 of the estimation device 1 as an example of the embodiment.

In FIG. 10, reference symbol F1 denotes an example of a simplified excitation circuit. The branch circuit pattern extraction unit 103 selects two end points (see reference symbol T) from the simplified excitation circuit, and extracts one or more circuit portions (branch circuit patterns) coupling the end points in an unbranched manner.

FIG. 10 exemplifies a branch circuit pattern denoted by reference symbol F2 and a branch circuit pattern denoted by reference symbol F3. An excitation source (see reference symbol A3) is coupled to each of the branch circuit patterns denoted by reference symbols F2 and F3.

When a simplified excitation circuit includes a plurality of branch points, the branch circuit pattern extraction unit 103 extracts a branch circuit pattern for each of the branch points (see step SA9 in FIG. 5).

A method of extracting a branch circuit pattern performed by the branch circuit pattern extraction unit 103 when the simplified excitation circuit includes a plurality of branch points will be described with reference to FIGS. 11 to 13.

Figure 11:
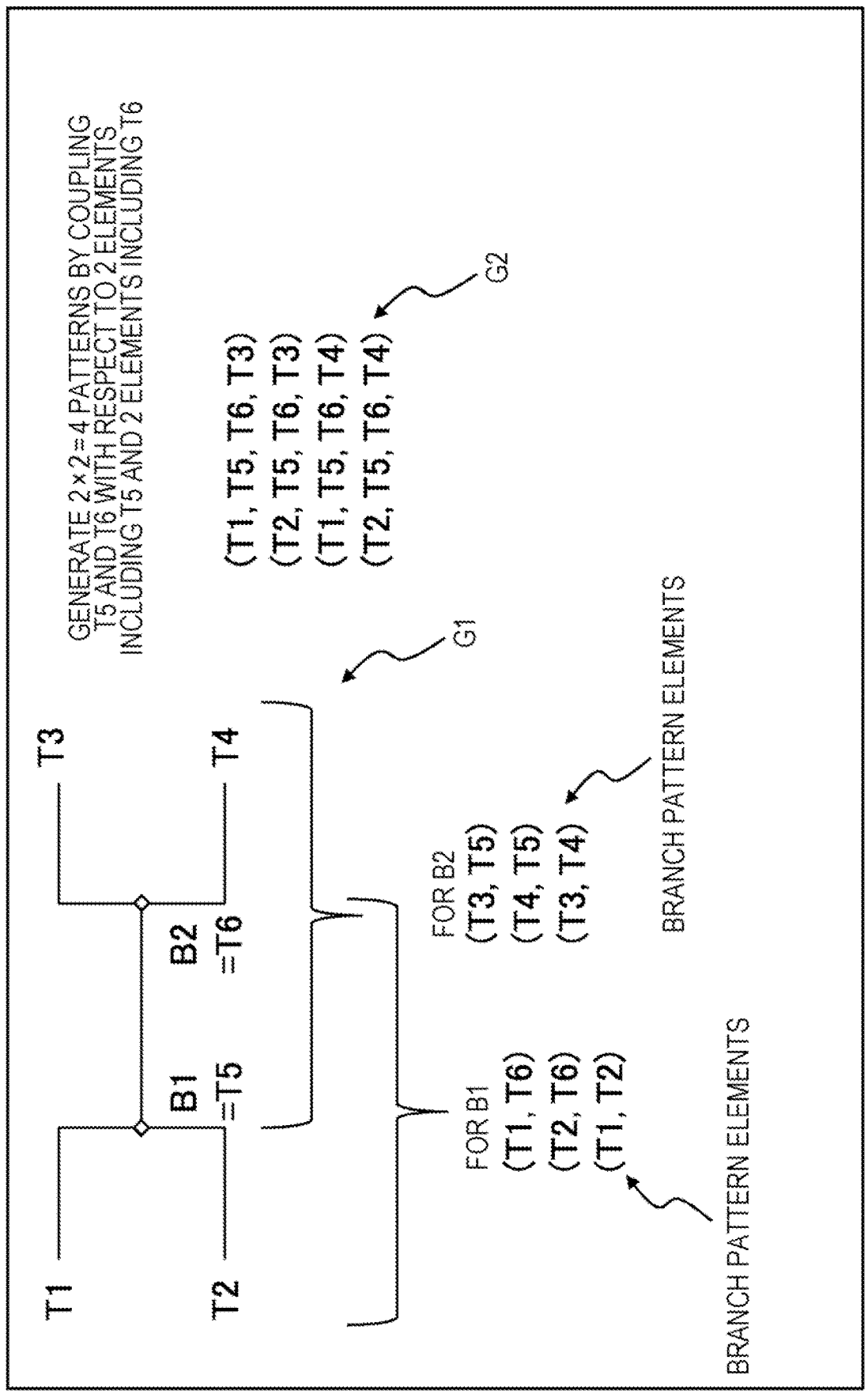
FIG. 11 is a diagram illustrating a method of extracting a branch circuit pattern performed by the branch circuit pattern extraction unit when the simplified excitation circuit includes a plurality of branch points.

Reference symbol G1 in FIG. 11 denotes an example of a simplified excitation circuit including four end points T1 to T4 and two branch points B1 and B2.

In the simplified excitation circuit denoted by reference symbol G1, the branch point B1 and the branch point B2 are coupled, and the end point T1 and the end point T2 are coupled in parallel on the side of the branch point B1 opposite to the branch point B2. The end point T3 and the end point T4 are coupled in parallel on the side of the branch point B2 opposite to the branch point B1.

The branch circuit pattern extraction unit 103 extracts a branch circuit pattern for each of the branch points B1 and B2. When one branch point is coupled to another branch point, the branch circuit pattern extraction unit 103 extracts a branch circuit pattern for the one branch point with the other branch point assumed (pretending) to be an end point.

The branch circuit pattern extraction unit 103 combines (joins/couples) the branch circuit patterns extracted for the respective branch points to generate a branch circuit pattern in the entire simplified excitation circuit.

In the example denoted by reference symbol G1 in FIG. 11, the branch point B1 is assumed to be an end point T5 and the branch point B2 is assumed to be an end point T6.

Hereinafter, a branch circuit pattern is expressed with end points included in the branch circuit pattern listed in parentheses. For example, a branch circuit pattern coupling the end points T1 and T6 is represented as (T1, T6).

The branch circuit pattern extraction unit 103 extracts (T1, T6), (T2, T6) and (T1, T2) as branch circuit patterns passing through the branch point B1 in the simplified excitation circuit denoted as an example by reference symbol G1 in FIG. 11. Furthermore, (T3, T5), (T4, T5), and (T3, T4) are extracted as branch circuit patterns passing through the branch point B2.

Hereinafter, the branch circuit patterns that are thus extracted for one branch point and pass through the branch point may be referred to as branch circuit pattern elements.

The branch circuit pattern extraction unit 103 joins the branch circuit pattern extracted for the branch point B1 and the branch circuit pattern extracted for the branch point B2 to generate a branch circuit pattern in the entire simplified excitation circuit.

In the simplified excitation circuit denoted by reference symbol G1 in FIG. 11, the end point T5 and the end point T6 are coupled to each other. Thus, the branch circuit pattern extraction unit 103 couples the branch circuit pattern element extracted for the branch point B1 and the branch circuit pattern element extracted for the branch point B2 to each other so as to relay between the end points T5 and The branch circuit pattern extraction unit 103 selects two branch circuit pattern elements (T1, T6), and (T2, T6) including the end point. T6 extracted for the branch point B1. The branch circuit pattern extraction unit 103 selects two branch circuit pattern elements (T3, T5), and (T4, T5) including the end point T5 extracted for the branch point B2.

The branch circuit pattern extraction unit 103 couples the end points T5 and T6, thereby generating four combinations configured by combining the two branch circuit pattern elements (T1, T6) and (T2, T6) and the two branch circuit pattern elements (T3, T5) and (T4, T5).

Thus, the branch circuit pattern extraction unit 103 generates the following four branch circuit patterns denoted by G2 in FIG.

(T1, T5, T6, T3),
(T2, T5, T6, T3),
(T1, T5, T6, T4),
(T2, T5, T6, T4)

Also in a case where the simplified excitation circuit includes three or more branch points, the branch circuit patterns may be similarly generated by combining the branch circuit pattern elements extracted for the respective branch points according to the coupling relationship in the simplified excitation circuit.

As described above, in the present estimation device 1, the branch circuit pattern extraction unit 103 determines a branch circuit pattern element for each branch point, and generates a branch circuit pattern by combining these branch circuit pattern elements. For example, the branch circuit pattern extraction unit 103 performs processing focusing on the branch points when generating the branch circuit pattern.

The branch circuit pattern extraction unit 103 stores the generated branch circuit pattern in the storage unit 20 as the branch circuit pattern data 23.

Next, with reference to FIGS. 12 and 13, a reason why the branch circuit pattern extraction unit 103 in the present estimation device 1 focuses on the branch points will be described. FIG. 12 is a diagram exemplifying a method of generating a branch circuit pattern by focusing on only end points without focusing on branch points in the simplified excitation circuit, and FIG. 13 is a diagram exemplifying a method of generating a branch circuit pattern by focusing on branch points in the simplified excitation circuit.

Figure 12:
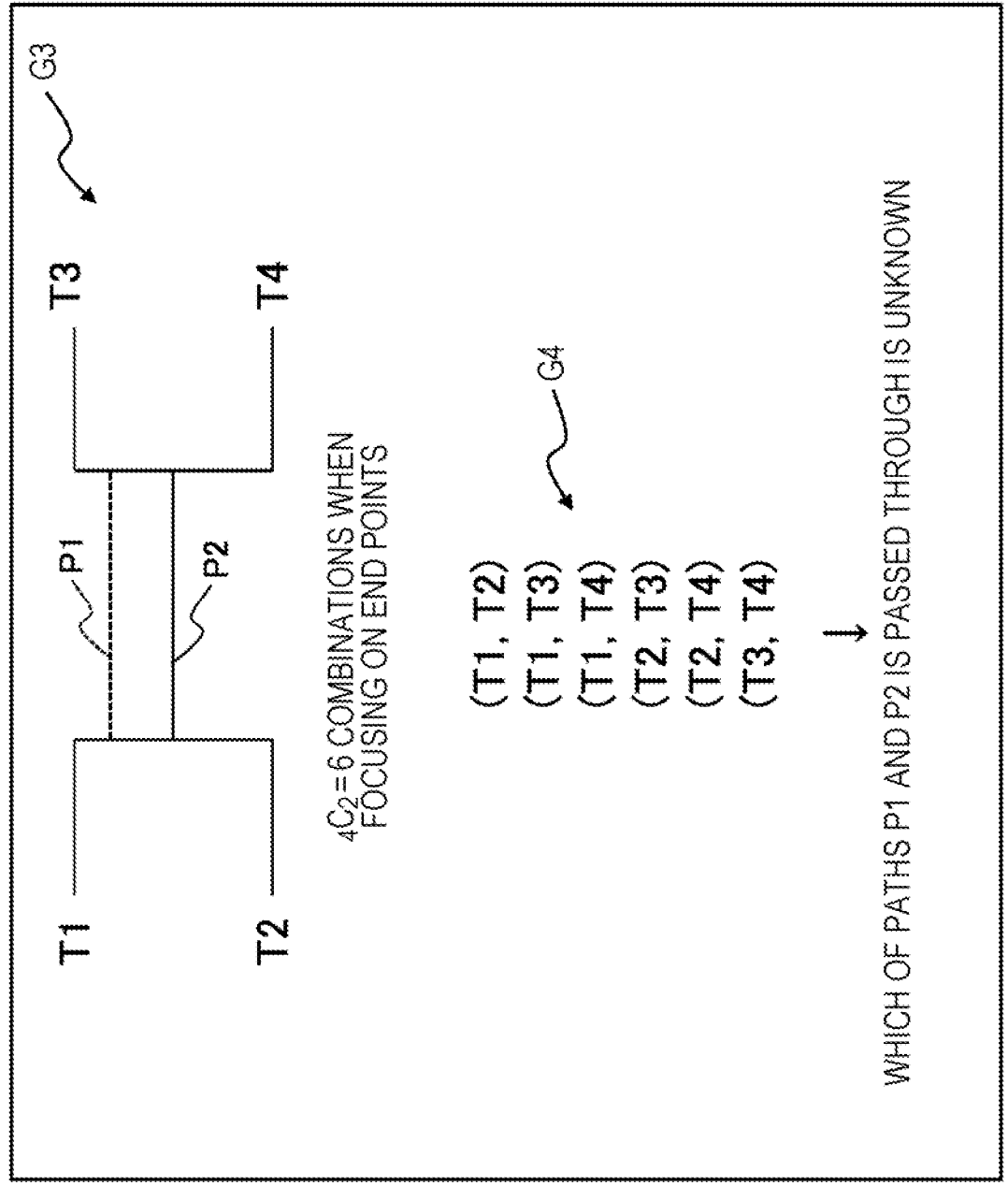
FIG. 12 is a diagram illustrating a method of extracting a branch circuit pattern performed by the branch circuit pattern extraction unit when the simplified excitation circuit includes a plurality of branch points.

In a simplified excitation circuit denoted as an example by reference symbol G3 in FIG. 12, two parallel paths P1 and P2 are provided instead of coupling the branch points B1 and B2 in the simplified excitation circuit denoted by reference symbol G1 in FIG. 11. For example, in FIG. 12, the two end points T1 and T2 provided on the left side of the simplified excitation circuit are coupled to the two end points T3 and T4 provided on the right side of the simplified excitation circuit through the path P1. Similarly, the two end points T1 and T2 are coupled to the two end points T3 and T4 provided on the right side of the simplified excitation circuit also through the path P2.

When focusing on the four end points T1 to T4 included in the simplified excitation circuit denoted by reference symbol G3 in FIG. 12, $_4C_2=6$ combinations (branch circuit patterns) of two end points out of these four end points T1 to T4 are obtained (see reference symbol G4 in FIG. 12). However, with such a combination of end points, which of the paths P1 and P2 is passed through may not be identified.

Figure 13:
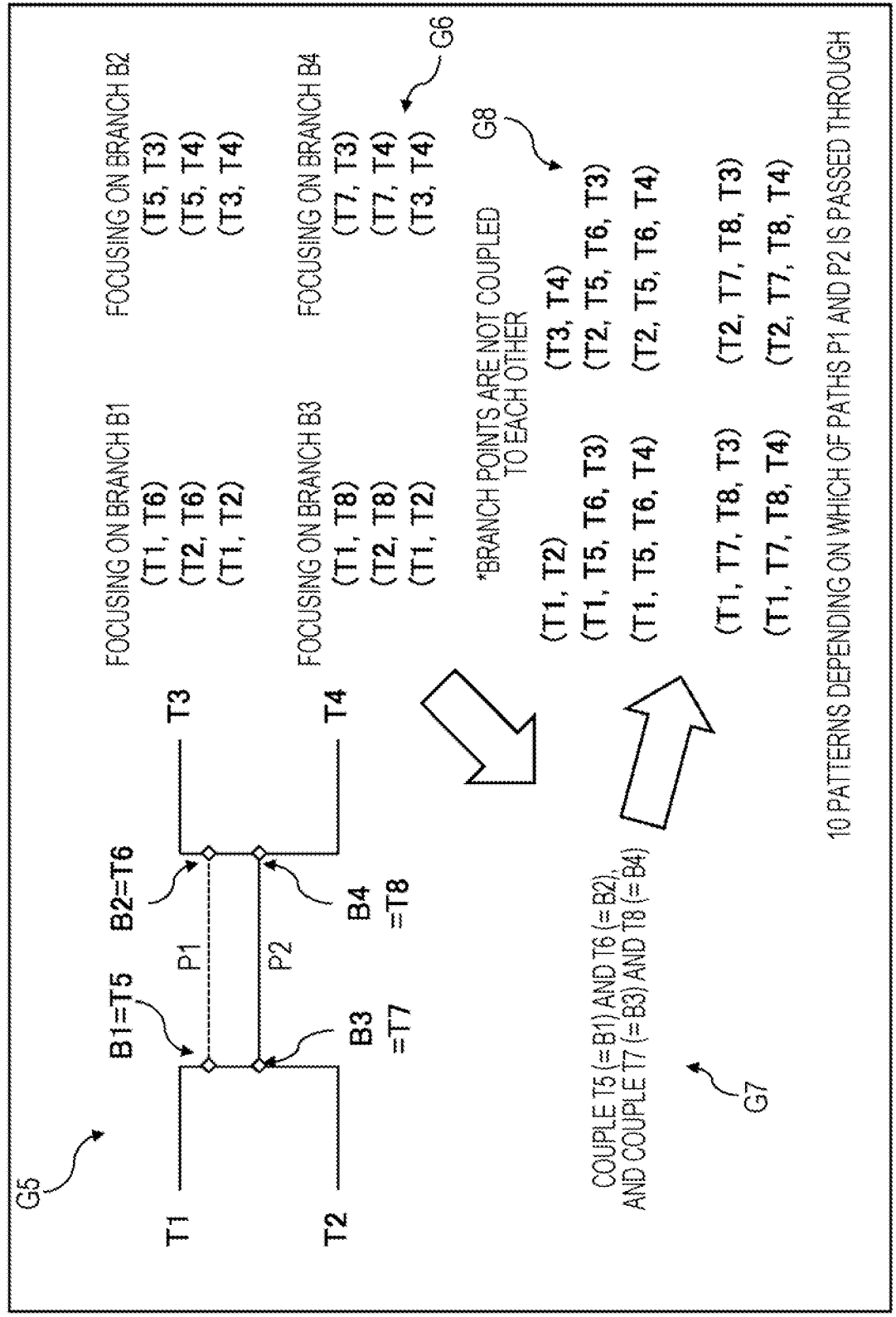
FIG. 13 is a diagram illustrating a method of extracting a branch circuit pattern performed by the branch circuit pattern extraction unit when the simplified excitation circuit includes a plurality of branch points.

On the other hand, in the present estimation device 1, as denoted by reference symbol G5 in FIG. 13, reference symbol B1 denotes a branch point on the side of the path P1 coupled to the end points T1 and T2, and reference symbol B2 denotes a branch point on the side coupled to the end points T3 and T4. The branch point B1 may be referred to as an end point T5 and the branch point B2 may be referred to as an end point T6.

Similarly, reference symbol B3 denotes a branch point on the side of the path P2 coupled to the end points T1 and T2, and reference symbol B4 denotes a branch point on the side coupled to the end points T3 and T4. The branch point B3 may be referred to as an end point T7 and the branch point B4 may be referred to as an end point T8.

The branch circuit pattern extraction unit 103 extracts a branch circuit pattern element by focusing on each branch point. At this point, the branch points are not coupled to each other.

For example, as denoted by reference symbol G6 in FIG. 13, the branch circuit pattern extraction unit 103 extracts three branch circuit pattern elements (T1, T6), (T2, T6), and (T1, T2) including the end point T6 extracted for the branch point. B1. The branch circuit pattern extraction unit 103 extracts three branch circuit pattern elements (T5, T3), (T5, T4), and (T3, T4) including the end point T5 extracted for the branch point B2.

The branch circuit pattern extraction unit 103 extracts three branch circuit pattern elements (T1, T8), (T2, T8), and (T1, T2) including the end point T8 extracted for the branch point 132. The branch circuit pattern extraction unit 103 extracts three branch circuit pattern elements (T7, T3), (T7, T4), and (T3, T4) including the end point T7 extracted for the branch point B4.

The branch circuit pattern extraction unit 103 couples the end point T5 (branch point B1) to the end point T6 (branch point B2) and couples the end point T7 (branch point P3) to the end point T8 (branch point B4) (see reference symbol G7 in FIG. 13), and combines the branch circuit pattern elements extracted for the respective branch points.

Thus, as denoted by reference symbol G8 in FIG. 13, 10 branch circuit patterns including information indicating which of the paths P1 and P2 is passed through may be generated. For example, the branch circuit pattern indicated by (T1, T5, T6, T3) includes the end points T5 and T6, and thus may be recognized to include the path P1 coupling the branch points B1 and B2 to each other.

The information configuring the branch circuit pattern generated by the branch circuit pattern extraction unit 103 may be stored in a predetermined storage area such as the memory 12 (see FIG. 33) or the storage device 13. Thus, the branch circuit pattern generated by the branch circuit pattern extraction unit 103 may be transferred to the noise estimation unit 104.

The noise estimation unit 104 estimates far electromagnetic noise for each branch circuit pattern generated by the branch circuit pattern extraction unit 103. The noise estimation unit 104 combines these far electromagnetic noise estimation results performed for the respective branch circuit patterns, and obtains the maximum noise intensity (MAX value) for each spectrum, thereby predicting far electromagnetic noise (radiated electromagnetic waves) in a far field of the excitation circuit. Hereinafter, the far electromagnetic noise may be simply referred to as noise.

When a circuit has a branch, the highest current, among currents (branch currents) flowing through the circuits while being divided due to the branch, determines the noise level of the entire circuit. In view of this, the noise estimation unit

104 of the present estimation device 1 obtains the MAX value of an estimated value of each noise estimated for a corresponding one of a plurality of branch circuit patterns (branch circuits) generated based on the excitation circuit.

Figure 14:
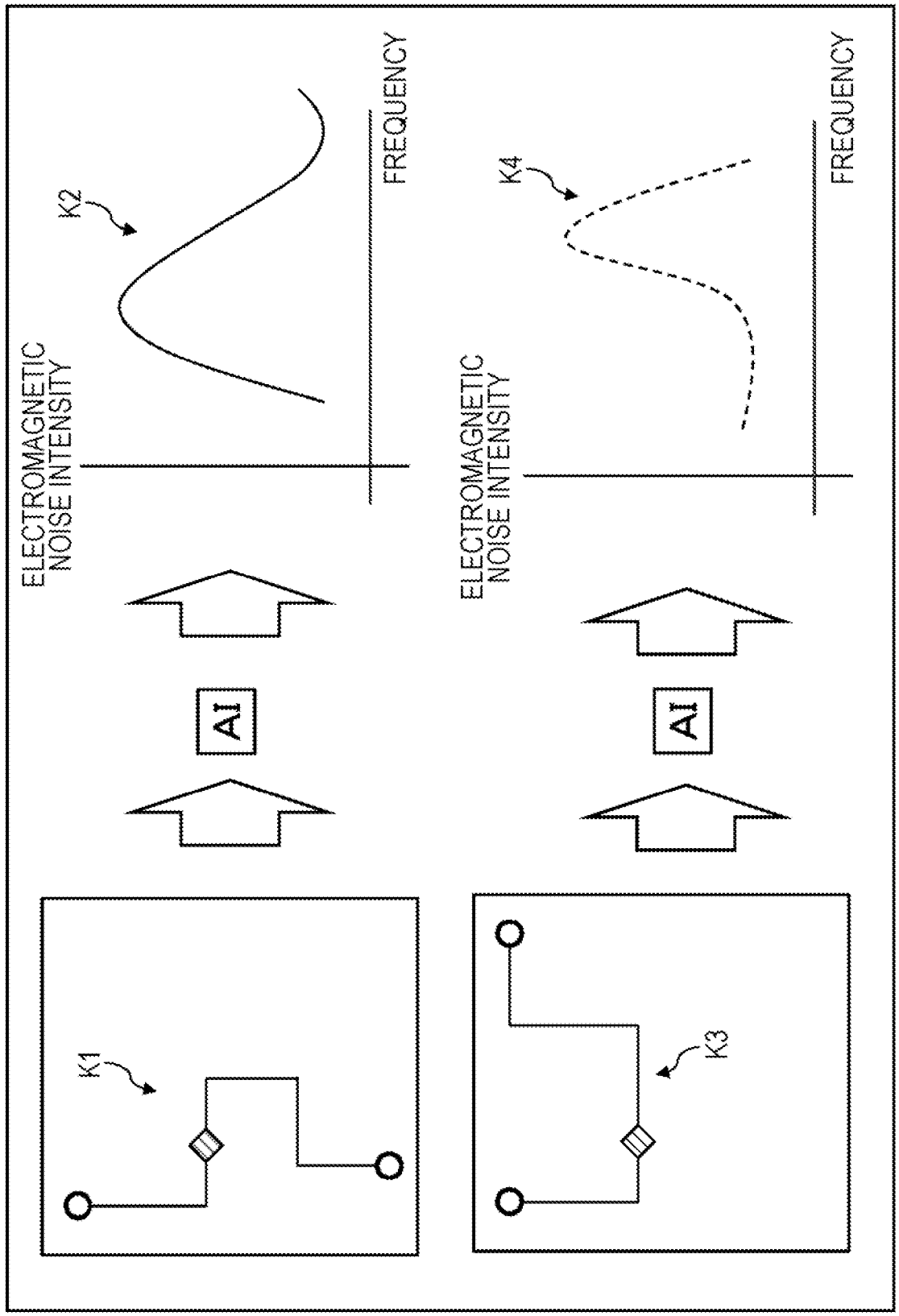
FIG. 14 is a diagram illustrating a method of estimating noise for each branch circuit pattern performed by a noise estimation unit of the estimation device as an example of the embodiment.

FIG. 14 is a diagram illustrating a method of estimating noise for each branch circuit pattern performed by the noise estimation unit 104 of the estimation device 1 as an example of the embodiment.

FIG. 14 illustrates a branch circuit pattern denoted by reference symbol K1 and a branch circuit pattern denoted by reference symbol K3.

The noise estimation unit 104 predicts the electromagnetic noise intensity as denoted by reference symbol K2 by using a result of a simulation using the AI on the branch circuit pattern denoted by reference symbol K1. Similarly, the noise estimation unit 104 predicts the electromagnetic noise intensity as denoted by reference symbol K4 by using a result of a simulation using the AI on the branch circuit pattern denoted by reference symbol K3.

The prediction of the electromagnetic noise intensity using the AI for the branch circuit pattern may be achieved by a known method, and thus the description thereof will be omitted.

An overview of processing executed by the noise estimation unit 104 of the estimation device 1 as an example of the embodiment will be described with reference to FIGS. 15 to 17.

Figure 15:
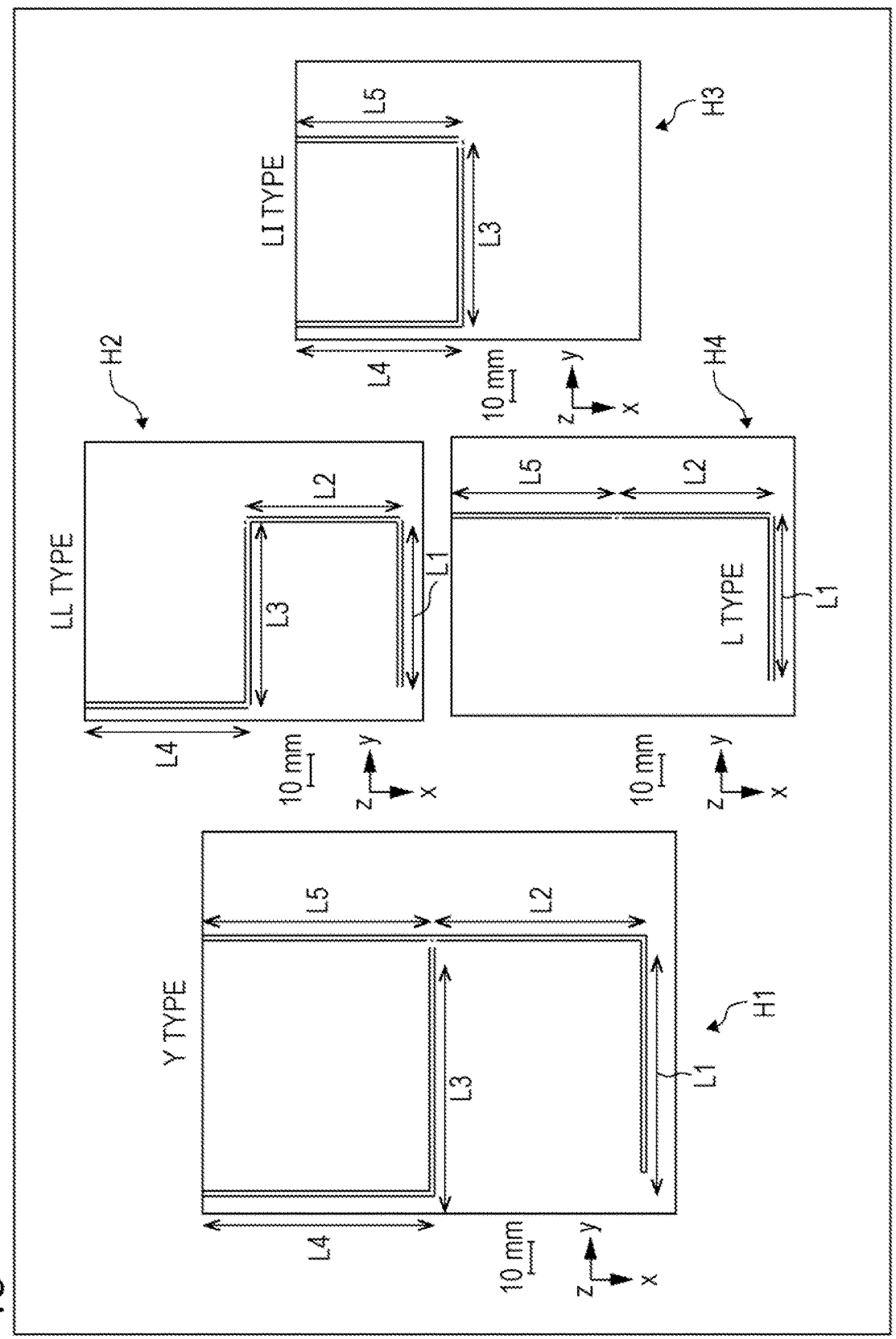
FIG. 15 is a diagram illustrating an overview of processing executed by the noise estimation unit of the estimation device as an example of the embodiment.

FIG. 15 is a diagram exemplifying an example of an excitation circuit and a branch circuit pattern extracted from the excitation circuit. In FIG. 15, reference symbol H1 denotes an excitation circuit (Y type), and reference symbols H2 to H4 denote branch circuit patterns (LL type, LI type, and L type) extracted from the excitation circuit denoted by reference symbol H1.

Figure 16:
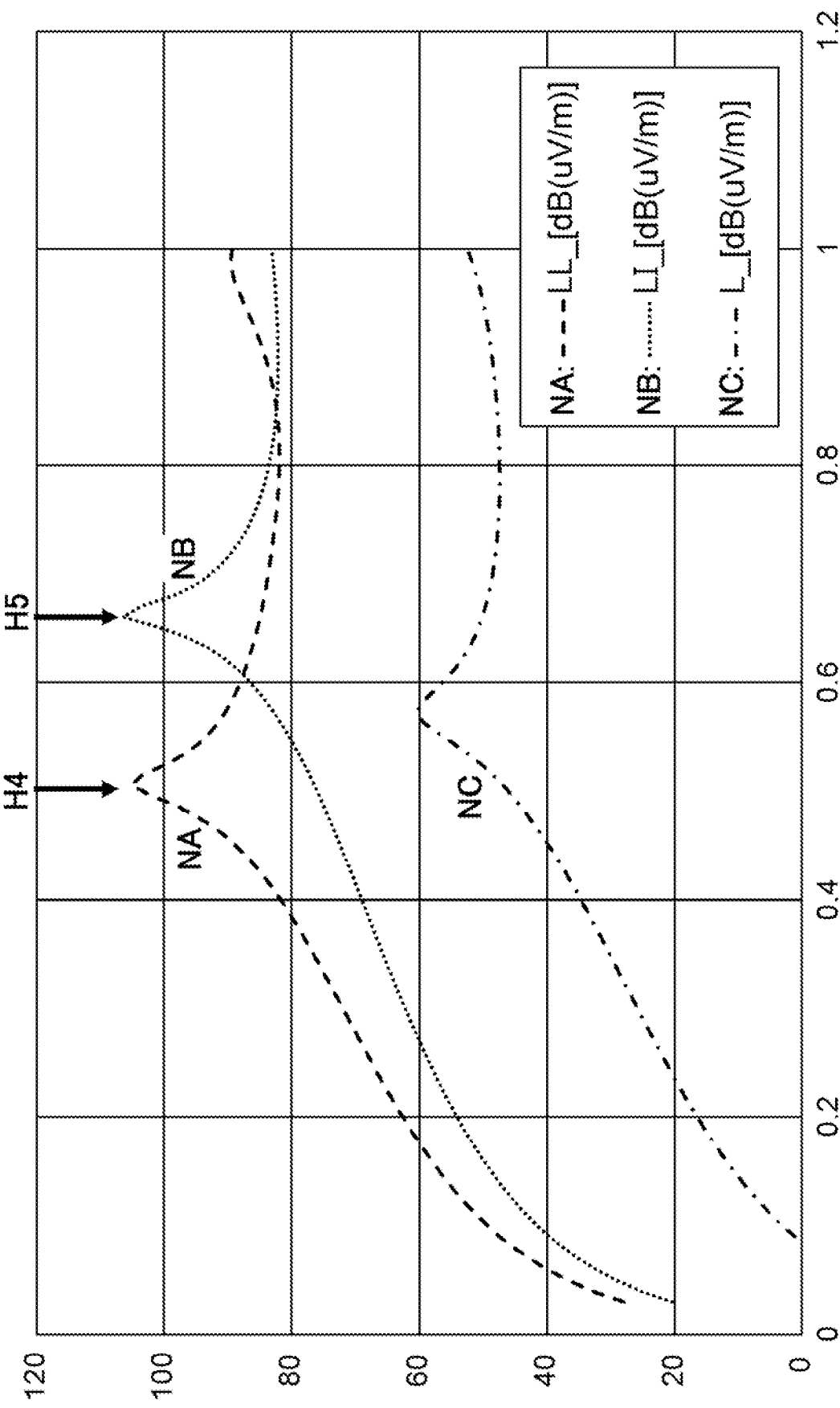
FIG. 16 is a diagram illustrating an overview of processing executed by the noise estimation unit of the estimation device as an example of the embodiment.

FIG. 16 is a graph exemplifying an estimated value of electromagnetic noise of each of the branch circuit patterns illustrated in FIG. 15. In the graph illustrated in FIG. 16, the horizontal axis represents frequency (unit: for example, Hz), and the vertical axis represents electromagnetic noise intensity (unit: for example, μV/m).

In FIG. 16, reference symbol NA denotes electromagnetic noise of the LL type branch circuit pattern denoted by reference symbol H2 in FIG. 15, reference symbol NB denotes electromagnetic noise of the LI type branch circuit pattern denoted by reference symbol H3 in FIG. 15, and reference symbol NC denotes electromagnetic noise of the L type branch circuit pattern indicated by reference symbol H4 in FIG. 15.

In FIG. 16, the frequency at which the electromagnetic noise peaks differs between the LL type branch circuit pattern denoted by reference symbol NA and the LI type branch circuit pattern denoted by reference symbol NB (see reference symbols H4 and H5). This indicates that the frequency of excitation differs among branch circuit patterns.

The noise estimation unit 104 obtains the maximum value of noise at each frequency from each of the branch circuit patterns extracted from the same excitation circuit. The noise estimation unit 104 uses, for example, a MAX function.

For example, the noise estimation unit 104 superimposes the noise values at the respective frequencies of the branch circuit patterns extracted from the same excitation circuit (see FIG. 16), and obtains the maximum value for each frequency. For example, in the example illustrated in FIG. 16, a value of the electromagnetic noise of the LL type branch circuit pattern denoted by reference symbol H2 in FIG. 15 denoted by reference symbol NA is selected at a frequency of 0.6 Hz or less. At a frequency higher than about 0.6 Hz, a value of the electromagnetic noise of the LI type branch circuit pattern denoted by reference symbol H3 in FIG. 15 denoted by reference symbol NB is selected.

Hereinafter, the maximum value of noise at each frequency of each branch circuit pattern extracted from the same excitation circuit may be simply referred to as a MAX value.

Figure 17:
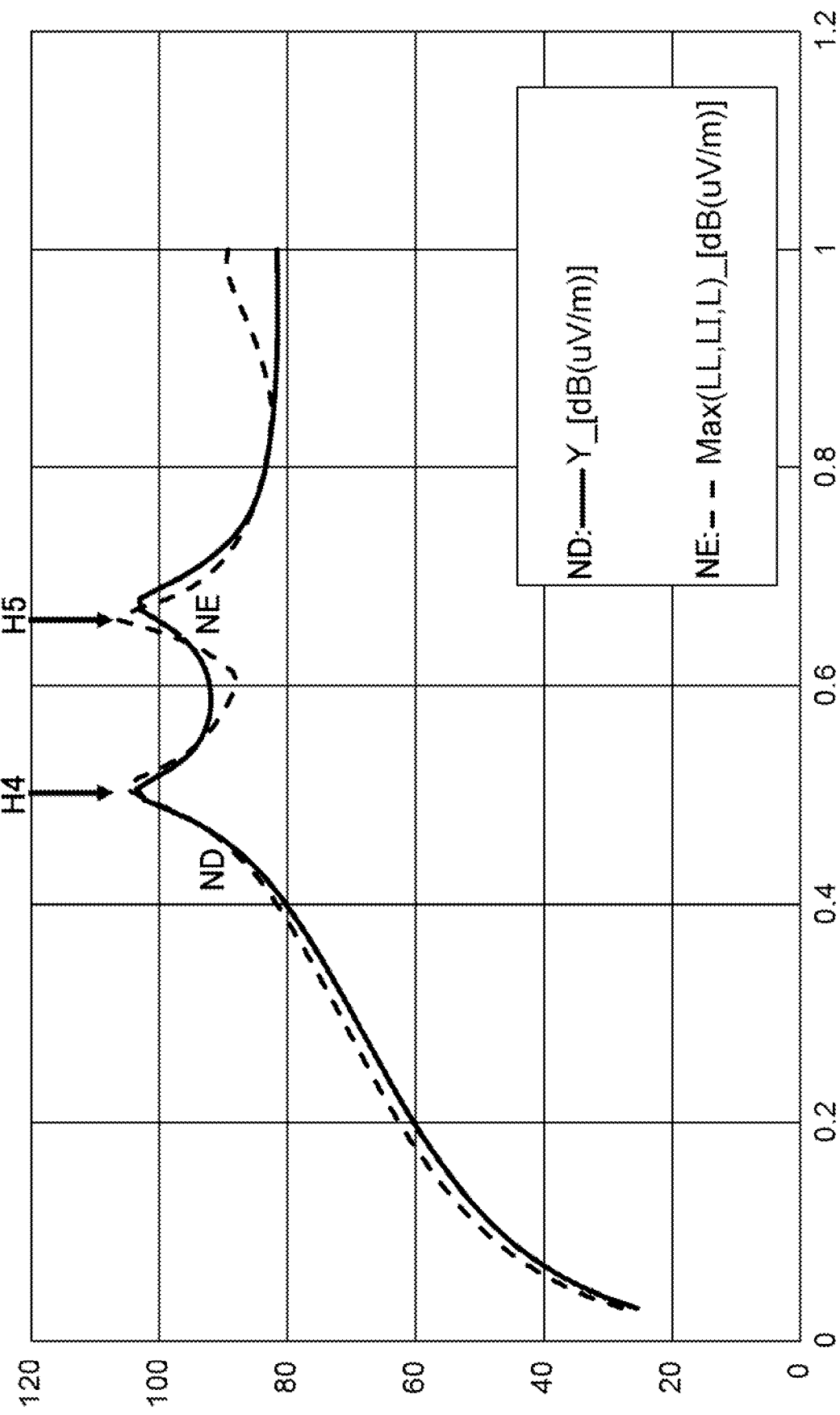
FIG. 17 is a diagram illustrating an overview of processing executed by the noise estimation unit of the estimation device as an example of the embodiment.

FIG. 17 is a graph exemplifying a MAX value of electromagnetic noise of each branch circuit pattern illustrated in FIG. 16. Also In the graph illustrated in FIG. 17, the horizontal axis represents frequency and the vertical axis represents electromagnetic noise intensity.

In FIG. 17, reference symbol NE denotes the MAX value of the electromagnetic noise of each branch circuit pattern illustrated in FIG. 16. In FIG. 17, reference symbol ND denotes a result of a simulation of far electromagnetic noise performed on the excitation circuit (V type) illustrated in FIG. 15.

With reference to FIGS. 18 to 21, a reason why the MAX value of noise at each frequency of each branch circuit pattern extracted from the same excitation circuit is obtained in the present estimation device 1 will be described.

Figure 18:
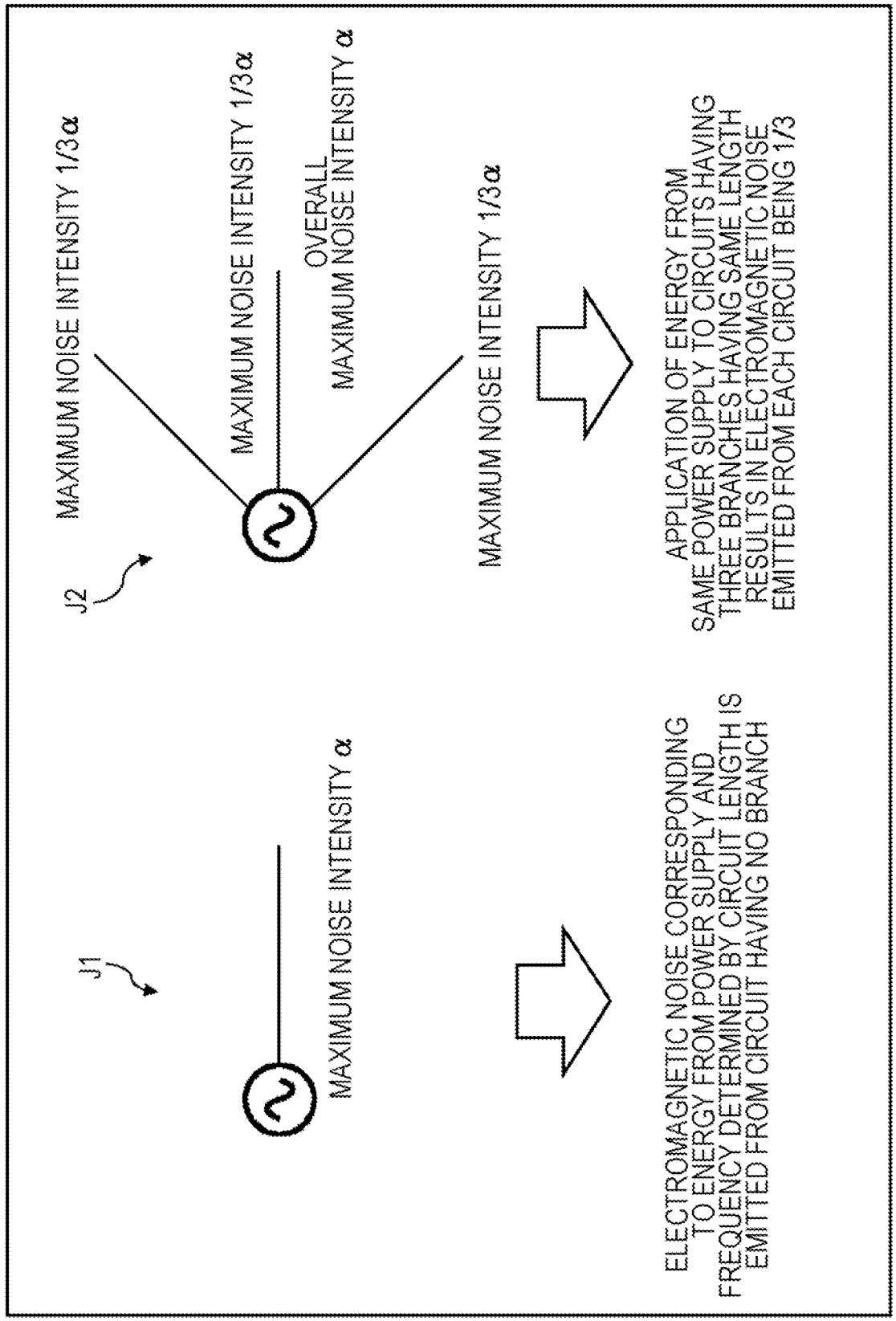
FIG. 18 is a diagram illustrating a reason why a MAX value of noise at each frequency of each branch circuit pattern extracted from the same excitation circuit is obtained in the estimation device as an example of the embodiment.

In FIG. 18, reference symbols 31 and 32 each denote an excitation circuit. The excitation circuit denoted by reference symbol 31 includes no branch, whereas the excitation circuit denoted by reference symbol 32 includes three branches having the same length.

The electromagnetic noise (maximum noise intensity α) corresponding to the energy from the power supply and the frequency determined by the circuit length is emitted from the circuit having no branch as denoted by reference symbol 31. On the other hand, application of energy from the same power supply to the circuits having the three branches having the same length as denoted by reference symbol 32 results in the electromagnetic noise emitted from each of the circuits being ⅓. The sum of the maximum noise intensities emitted from the respective branches is equal to the maximum noise intensity α.

Figure 19:
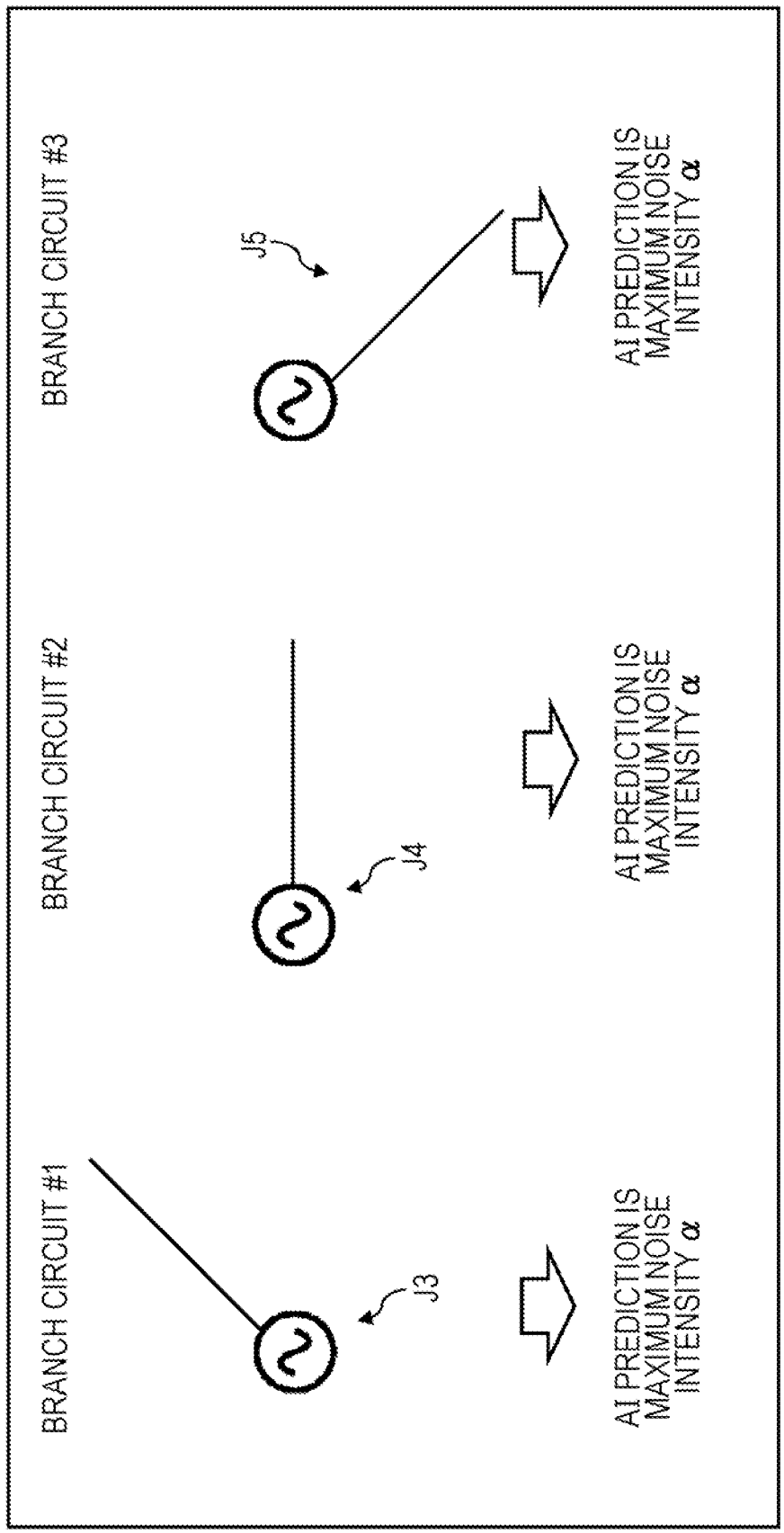
FIG. 19 is a diagram illustrating a reason why the MAX value of noise at each frequency of each branch circuit pattern extracted from the same excitation circuit is obtained in the estimation device as an example of the embodiment.

FIG. 19 is an exploded view of the three branch circuits denoted by reference symbol 32 in FIG. 18.

In FIG. 19, reference symbols 33 to 35 denote three respective circuits configuring the three branch circuits denoted by reference symbol 32. A circuit denoted by reference symbol 33 is referred to as a branch circuit #1, a circuit denoted by reference symbol 34 is referred to as a branch circuit #2, and a circuit denoted by reference symbol 35 is referred to as a branch circuit #3.

When the AI is used to predict the noise intensity for each of the branch circuits #1 to #3 extracted from one circuit branched in three, the AI outputs a prediction value assuming that each of the branch circuits #1 to #3 has received the total energy supplied from the power supply. For example, the sum of the noise intensities of the branch circuits #1 to #3 is 30 (maximum noise intensity).

In the present estimation device 1, the MAX value of the noise at each frequency of each branch circuit pattern extracted from the same excitation circuit by the noise estimation unit 104 is obtained, whereby the accuracy of the estimation value of the noise intensity obtained by the AI is improved.

Figure 20:
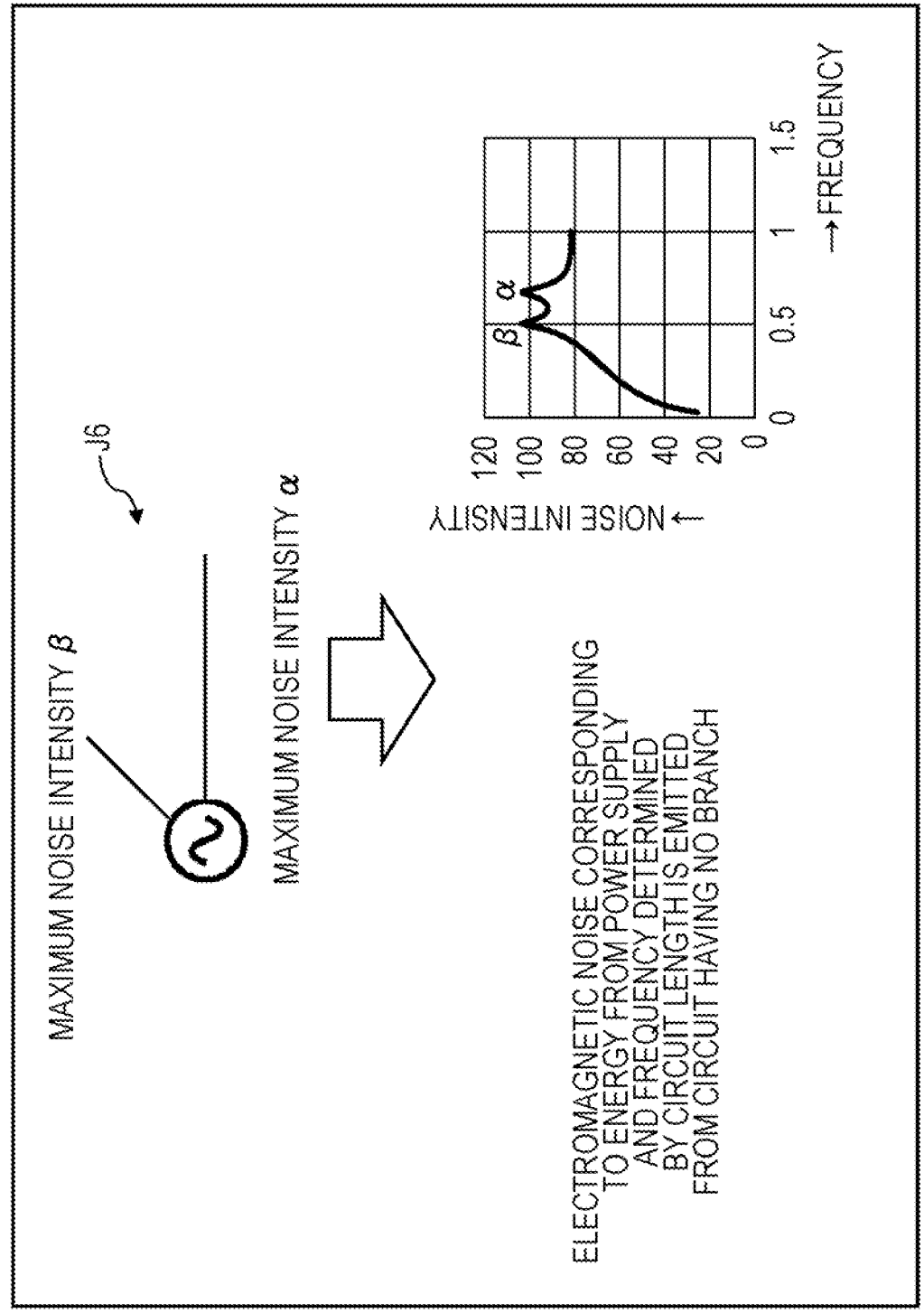
FIG. 20 is a diagram illustrating a reason why the MAX value of noise at each frequency of each branch circuit pattern extracted from the same excitation circuit is obtained in the estimation device as an example of the embodiment.

In FIG. 20, reference symbol 36 denotes an excitation circuit. The excitation circuit denoted by reference symbol 36 includes two branch circuits having different lengths: a branch circuit having a maximum noise intensity of α and a branch circuit having a maximum noise intensity of β.

As described above, the electromagnetic noise (maximum noise intensity α) corresponding to the energy from the power supply and the frequency determined by the circuit length is emitted from the circuit having no branch.

Figure 21:
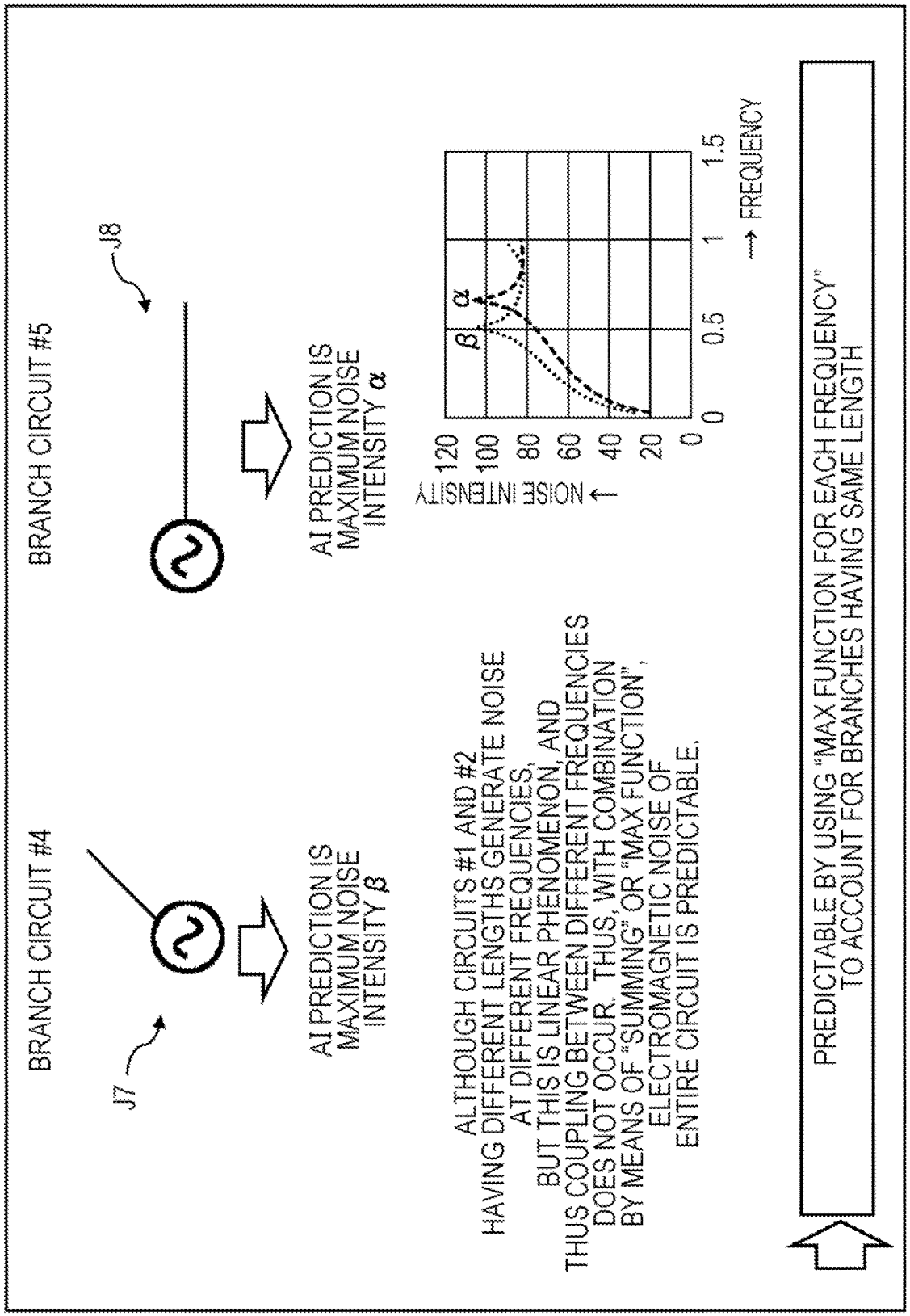
FIG. 21 is a diagram illustrating a reason why the MAX value of noise at each frequency of each branch circuit pattern extracted from the same excitation circuit is obtained in the estimation device as an example of the embodiment.

FIG. 21 is an exploded view of the two branch circuits denoted by reference symbol 36 in FIG. 20.

In FIG. 21, reference symbols 37 and 38 denote two respective circuits configuring the two branch circuits denoted by reference symbol 36. The circuit denoted by reference symbol 37 is referred to as a branch circuit #4, and the circuit denoted by reference symbol 38 is referred to as a branch circuit #5.

Although the branch circuit #4 and the branch circuit #5 having different lengths generate noise at different frequencies, but this is a linear phenomenon involving no transfer of energy between frequency components, and thus coupling between the different frequencies does not occur. Thus, with combination by means of "summing" or "MAX function", the electromagnetic noise of the entire excitation circuit is predictable. In the present estimation device 1, the noise of the excitation circuit is predicted by using the "MAX function for each frequency" instead of "summing" to account for branches having the same length.

In the present estimation device 1, a circuit with the number of times of bending being not more than five (equal to or less than five) may be held as training data for the AI, to implement exhaustive learning on unbranched circuits in the noise estimation unit 104. The training data may be stored in the storage unit 20.

Figure 22:
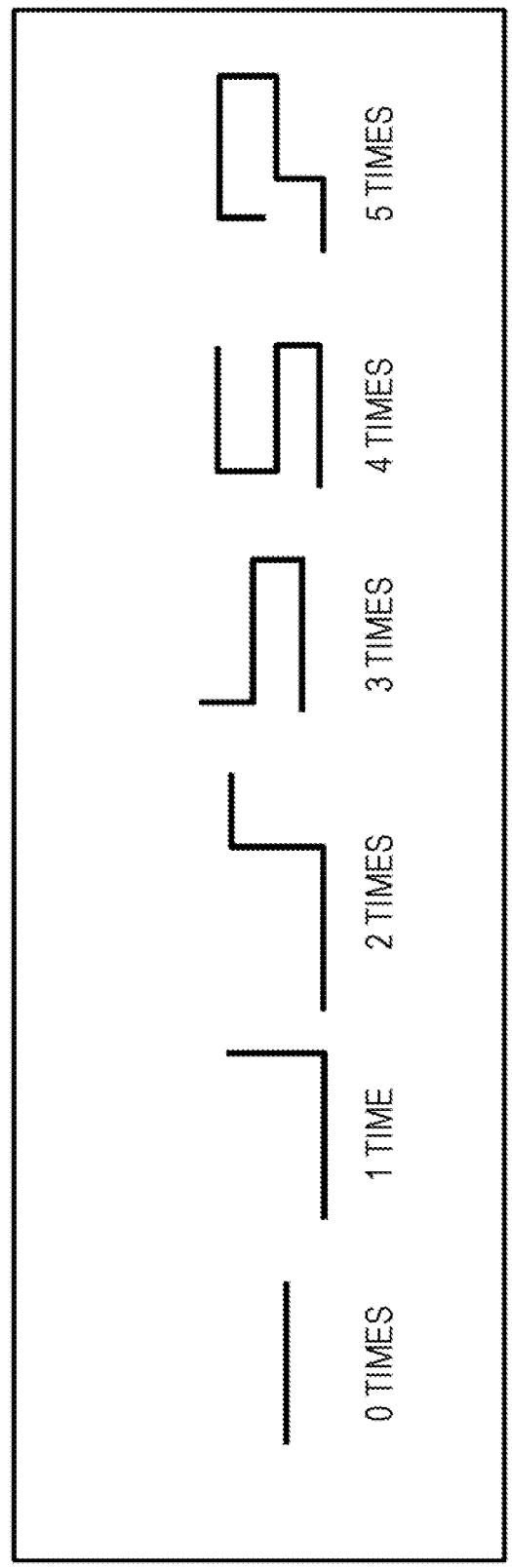
FIG. 22 is a diagram exemplifying a circuit with the number of times of bending being not more than five.

FIG. 22 is a diagram exemplifying a circuit with the number of times of bending being not more than five.

It is assumed that the noise estimation unit 104 excludes a circuit having an intersection from the training data. With a simple calculation, $\Sigma 2^i = 63$ cases are obtained, but the number may be reduced to 23 cases by excluding cases involving point symmetry and cases involving line symmetry.

When the lengths of line segments are classified into three patterns, a total of 9057 patterns are obtained. This is a smaller number than variations (the number of types) of circuits obtained by combining pieces of training data. For example, the estimation of the radiated electromagnetic waves of various electronic circuits may be achieved with a smaller amount of training data. Considering the fact that there are some patterns with intersections, jutting outs, and the like, the actual number of patterns is even smaller.

The maximum number of times of bending is not limited to five, and may be changed as appropriate.

FIG. 23 is a diagram exemplifying the number of patterns of training data based on a circuit configuration.

FIG. 23 illustrates the number of patterns based on a combination of the number of times of bending, the number of bending patterns, and the number of line length patterns.

As illustrated in FIG. 23, when the number of times of bending is not more than five, the training data includes the maximum of 7290 patterns.

In the present estimation device 1, the symmetry of the circuit is also taken into consideration in order to reduce the training data.

Figure 24:
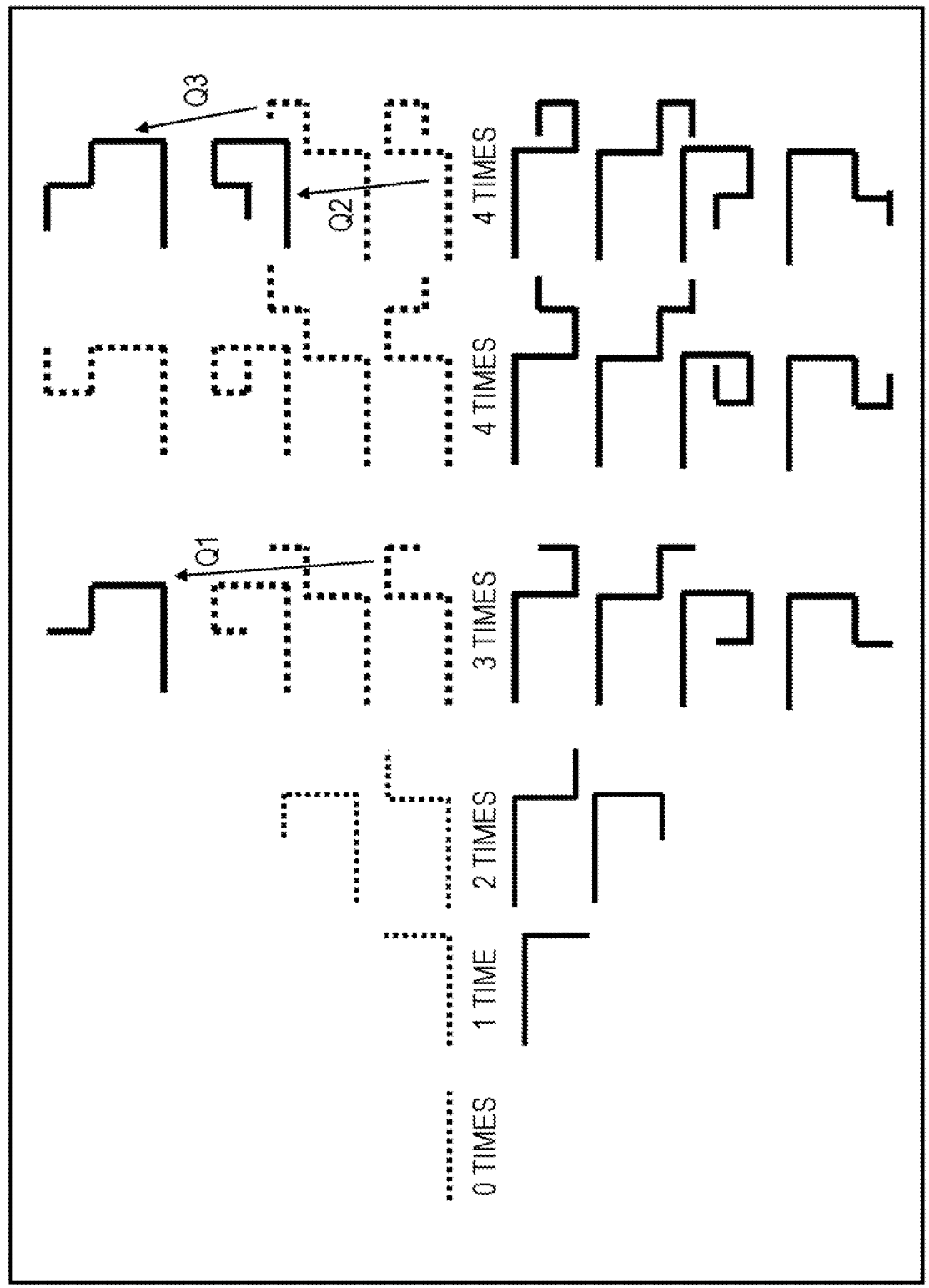
FIG. 24 is a diagram illustrating the symmetry of a circuit.

FIG. 24 is a diagram illustrating the symmetry of a circuit. In FIG. 24, circuit shapes are extracted and illustrated exhaustively according to the number of times of bending (0 to 4 times) (see the circuit shapes expressed by dotted lines and solid lines in the drawing).

The far electromagnetic noise intensity does not depend on the orientation of the circuit over a plane, and thus is the same between rotationally symmetrical circuits and between line symmetrical circuits. Based on such characteristics, in the present estimation device 1, the training data is reduced by excluding the rotationally symmetrical circuits and the line symmetrical circuits (see reference symbols Q1 to Q3). Thus, in the example illustrated in FIG. 24, only circuits expressed by broken lines are stored and used as the training data.

In the example illustrated in FIG. 24, the number of times of bending is 0 to 4 for the sake of convenience. However, the number of times of bending is not limited to this, and may be changed as appropriate.

The noise estimation unit 104 performs prediction (simulation) of the electromagnetic noise intensity by using the AI trained with a branchless circuit.

The noise estimation unit 104 inputs an image of a branch circuit pattern to the learning model, and estimates a far field of electromagnetic waves using the learning model. The learning model is a learning model generated from teacher data in which training data (circuit image) that is data on a training circuit and data on a far field of electromagnetic waves ("far field data") indicating a simulation result of the learning circuit are paired. The far field data includes the intensity of the electromagnetic waves at each frequency.

The noise estimation unit 104 may estimate a far field of electromagnetic waves with high accuracy for the target circuit by thus using the learning model in which the influence of an intermediate portion (near field) on the electromagnetic waves is taken into consideration. In the estimation device 1, a far field of electromagnetic waves may be swiftly estimated by using an image of a branch circuit pattern as an input of the learning model without performing any simulation on the target circuit.

The noise estimation unit 104 refers to the training data based on the shape of the branch circuit pattern and selects a circuit having a shape similar to the shape of the branch circuit pattern from the training data. The noise estimation unit 104 estimates the electromagnetic noise intensity of the branch circuit pattern by using the far field corresponding to the selected training data.

Figure 25:
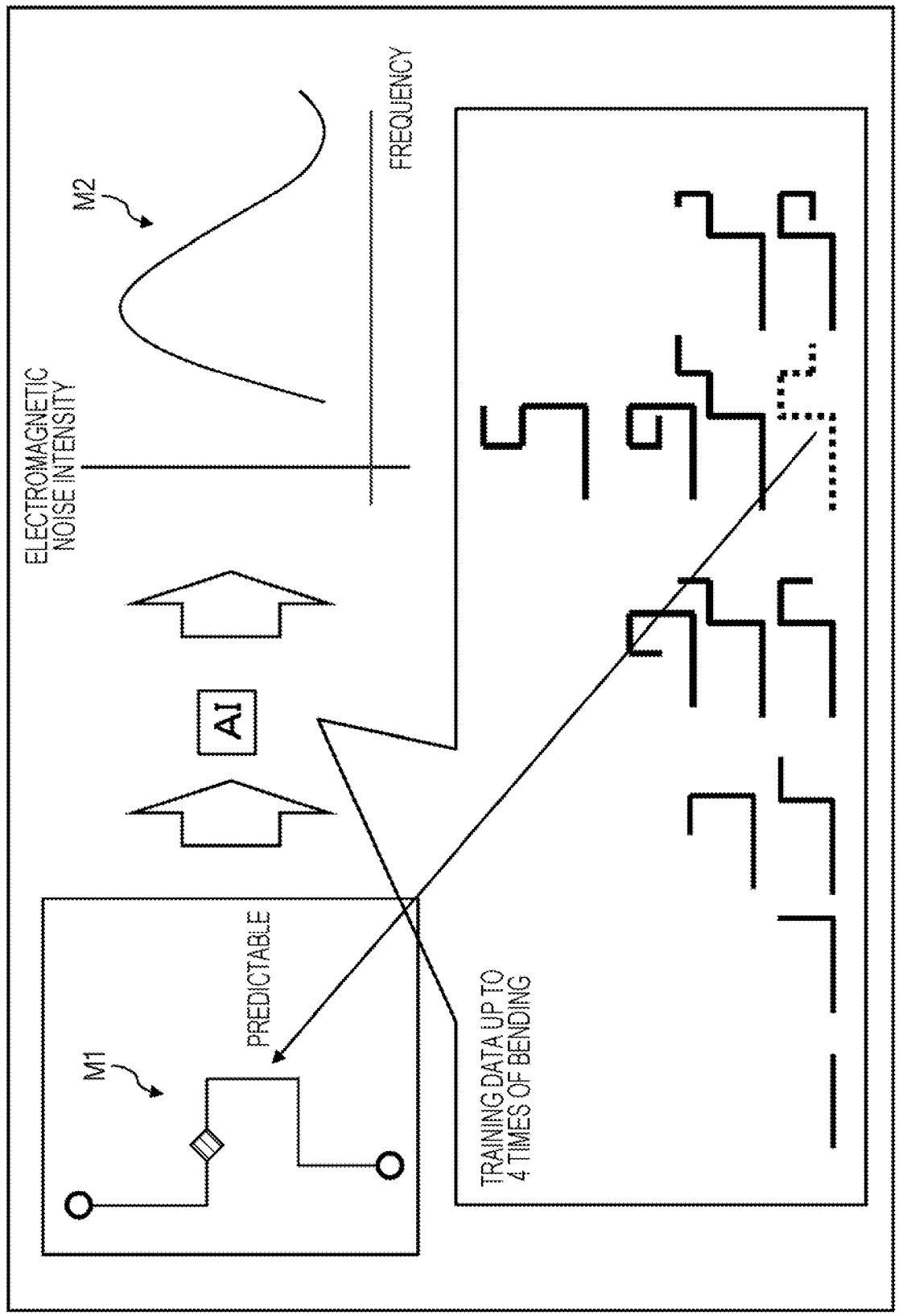
FIG. 25 is a diagram illustrating an electromagnetic noise intensity prediction method performed by the noise estimation unit in the estimation device as an example of the embodiment.
Figure 26:
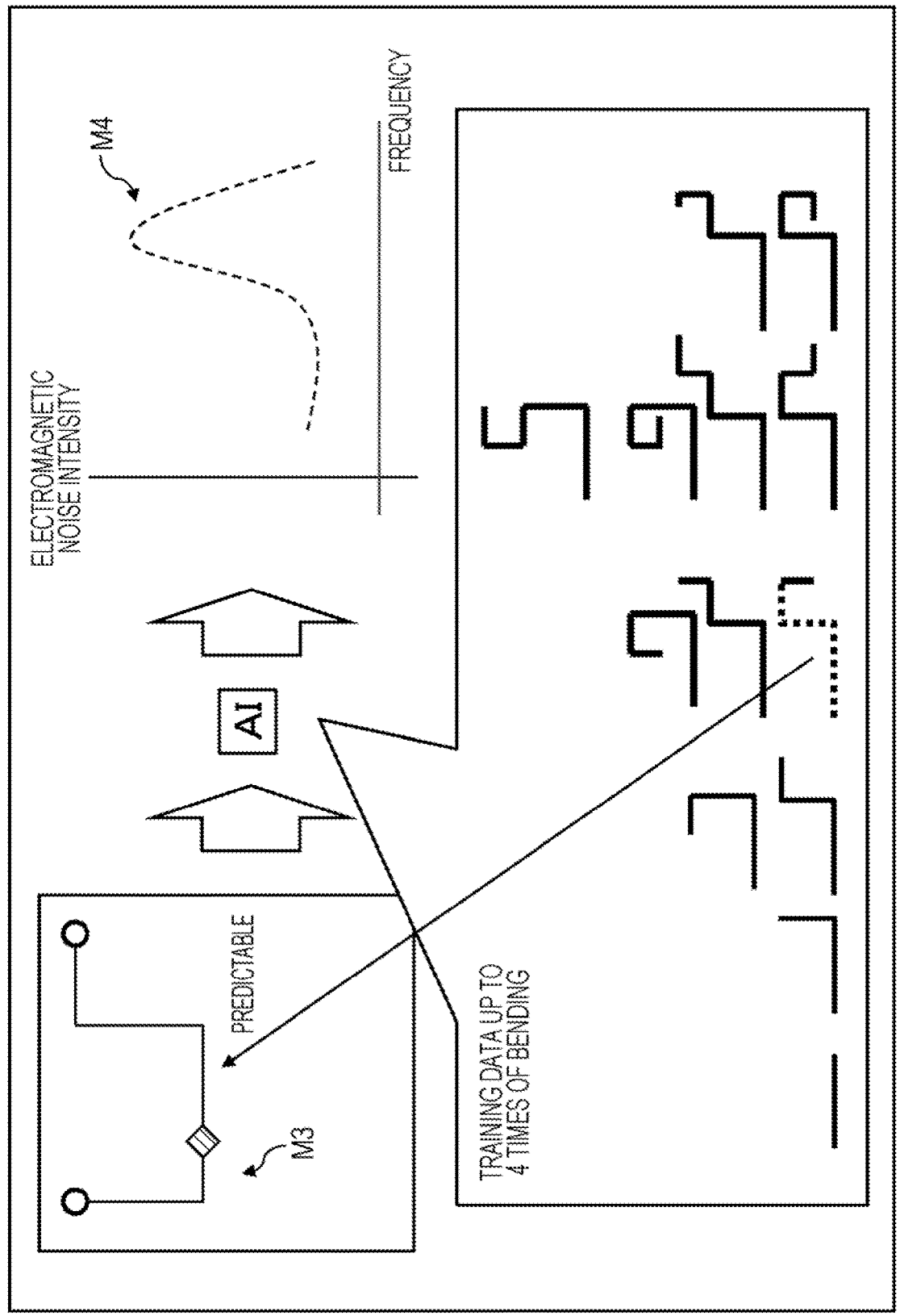
FIG. 26 is a diagram illustrating the electromagnetic noise intensity prediction method performed by the noise estimation unit in the estimation device as an example of the embodiment.
Figure 27:
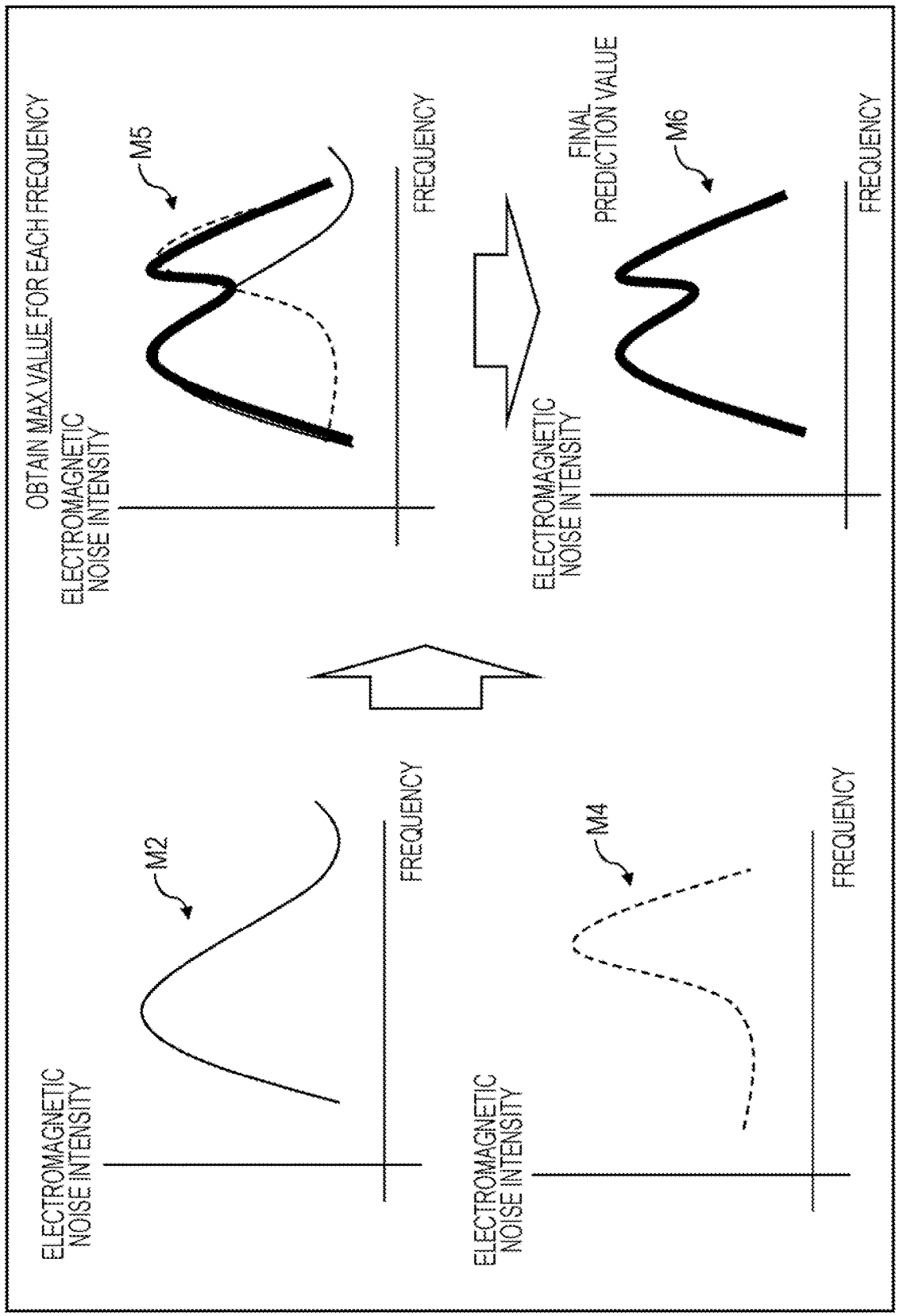
FIG. 27 is a diagram illustrating the electromagnetic noise intensity prediction method performed by the noise estimation unit in the estimation device as an example of the embodiment.

FIGS. 25 to 27 are each a diagram illustrating a method of predicting the electromagnetic noise intensity performed by the noise estimation unit 104 in the estimation device 1 as an example of the embodiment. FIGS. 25 and 26 are diagrams illustrating a method of estimating the electromagnetic noise intensity of the branch circuit pattern performed by the noise estimation unit 104, FIG. 27 is a diagram illustrating a method of predicting the electromagnetic noise intensity of the excitation circuit based on the electromagnetic noise intensity of the branch circuit pattern.

In the examples illustrated in FIGS. 25 and 26, the noise estimation unit 104 refers to the training data based on the image data on the branch circuit pattern denoted by reference symbol M1 or M3, and selects a circuit having the same number of times of bending, bending patterns, and line length patterns. The noise estimation unit 104 estimates the electromagnetic noise intensity of the branch circuit pattern by using the far field corresponding to the circuit of the selected training data (see reference symbols M2 and M4).

As illustrated in FIG. 27, the noise estimation unit 104 predicts the electromagnetic noise intensity of the excitation circuit (see reference symbol MG in FIG. 27) by obtaining the MAX value of the electromagnetic noise intensity of each branch circuit pattern (see reference symbol M5 in FIG. 27).

(B) Operations

Figure 28:
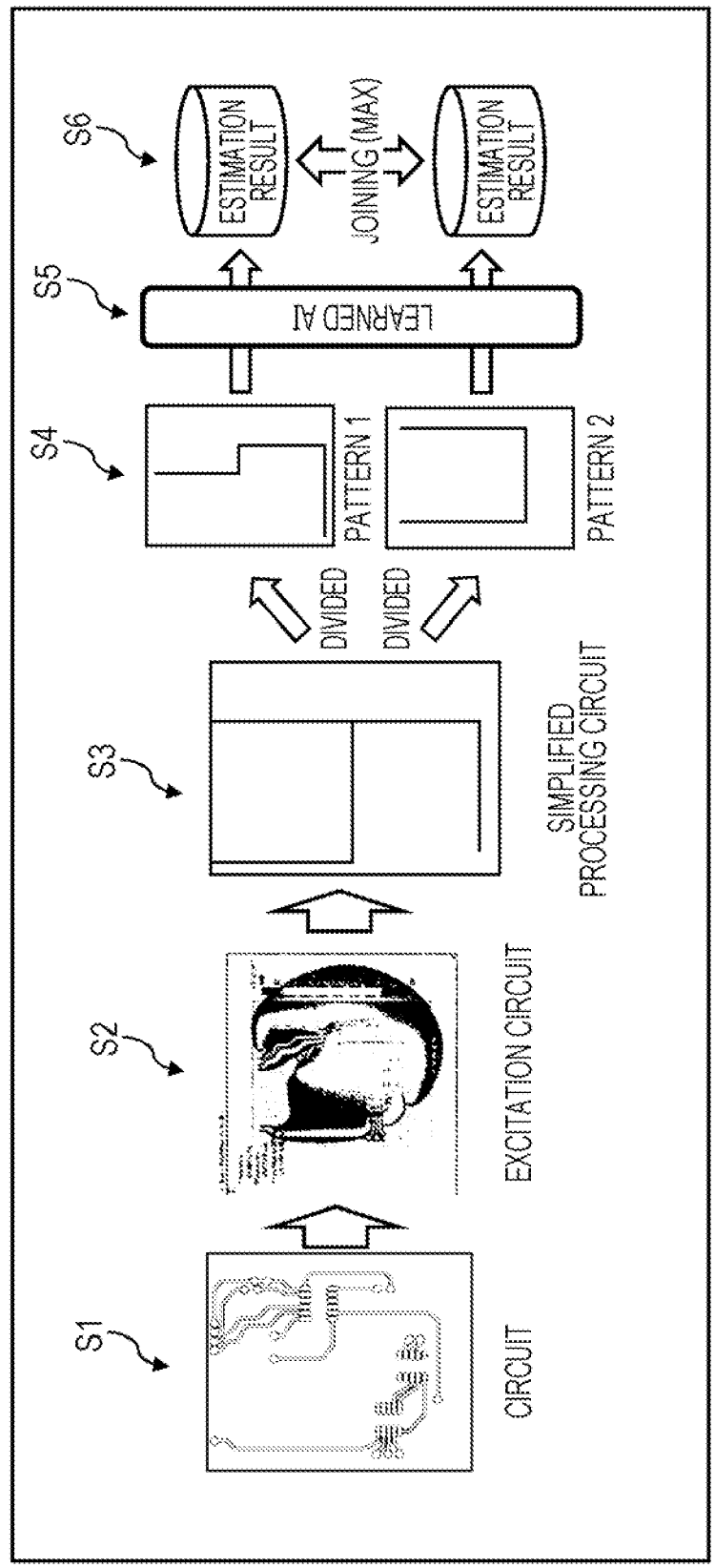
FIG. 28 is a diagram exemplifying an overview of processing executed on an analysis target circuit in the estimation device as an example of the embodiment.

An overview of a method of estimating radiated electromagnetic waves in an electric circuit performed in the estimation device 1 as an example of the embodiment configured as described above will be described along a flowchart (steps S11 to S17) illustrated in FIG. 29, while referring to FIG. 28. FIG. 28 is a diagram exemplifying an overview of processing executed on an analysis target circuit in the estimation device 1 as an example of the embodiment.

Figure 29:
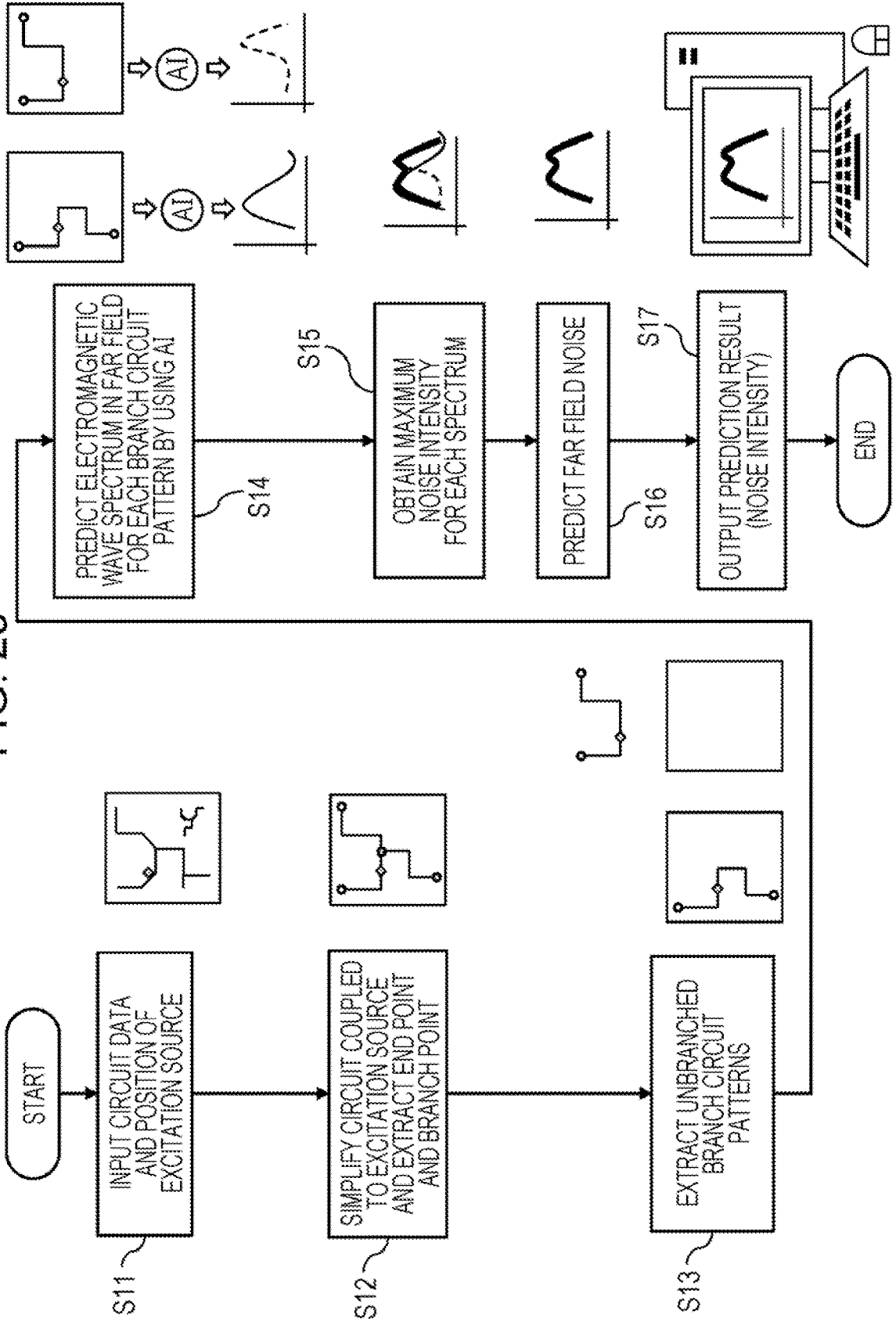
FIG. 29 is a flowchart illustrating an overview of a method of estimating radiated electromagnetic waves in an electric circuit in the estimation device as an example of the embodiment.

In step S11 in FIG. 29, an operator of the present estimation device 1 inputs circuit data on the analysis target circuit (see reference symbol S1 in FIG. 28) and information indicating the position of the excitation source by using a keyboard 15*a* and a mouse 15*b* via an input interface 14 in FIG. 33.

The excitation circuit extraction unit 101 extracts an excitation circuit that is a circuit coupled to an excitation source, from an analysis target circuit, based on the circuit data on the analysis target circuit. Reference symbol S2 in FIG. 28 denotes a state in which the excitation circuit is a generation source of electromagnetic noise.

The simplification processing unit 102 extracts a partial circuit based on the excitation circuit extracted by the excitation circuit extraction unit 101.

In step S12 in FIG. 29, the simplification processing unit 102 generates a simplified excitation circuit by simplifying the shape of the excitation circuit extracted by the excitation circuit extraction unit 101 (see reference symbol S3 in FIG. 28). The simplification processing unit 102 extracts an end point and a branch point in the simplified excitation circuit.

In step S13 of FIG. 29, the branch circuit pattern extraction unit 103 extracts a plurality of branch circuit patterns that are unbranched circuits, from the simplified excitation circuit generated by the simplification processing unit 102 (see reference symbol S4 in FIG. 28).

In step S14 of FIG. 29, the noise estimation unit 104 predicts the electromagnetic wave spectrum in the far field for each branch circuit pattern using the AI (see reference symbol S5 in FIG. 28). In step S15 in FIG. 29, the noise estimation unit 104 obtains a maximum noise intensity (MAX value) for each spectrum. The noise estimation unit 104 thus obtains the maximum noise intensity for each spectrum by obtaining the MAX values of the noise intensity of a plurality of branch circuit patterns, and uses the maximum noise intensity as a predicted value of far field noise of the excitation circuit (see step S16 in FIG. 29 and reference symbol S6 in FIG. 28). In step S17 in FIG. 29, the noise estimation unit 104 converts the determined prediction value (far field noise intensity) into a graphic in a graphic processing device 14 in FIG. 33, outputs the graphic to a monitor 14*a* or the like, and ends the processing.

Next, a method of extracting the median line of the excitation circuit performed by the simplification processing unit 102 of the estimation device 1 as an example of the embodiment will be described along a flowchart (steps S21 to S32) illustrated in FIG. 30.

In step S21, data or the like on the excitation circuit as the analysis target circuit is input to the simplification processing unit 102.

In steps S22 to S26 thereafter, the simplification processing unit 102 extracts a median line in the lateral direction (right direction) relative to the excitation circuit.

In step S22, the simplification processing unit 102 loads the image data on the excitation circuit onto a storage area (scanning space) of the memory 12 or the like, and, for example, extracts the median line of the circuit portion through scanning in the right direction with the upper left position of the excitation circuit serving as the base point.

In step S23, the simplification processing unit 102 checks whether there is any circuit from which the median line in the right direction has not been extracted. When a result of this checking indicates that there is a circuit portion from which the median line has not been extracted by the scanning in the right direction (see the YES route from step S23), the processing proceeds to step S24. After a circuit portion from which a median line in the right direction has not been extracted is extracted in step S24, the processing returns to step S22 in which a median line is extracted for the extracted circuit portion.

When a result of the checking in step S23 indicates that there is no circuit portion from which the median line has not been extracted by the scanning in the right direction (see the NO route from step S23), the processing proceeds to step S25.

In step S25, the simplification processing unit 102 couples, with a coupling straight line, a median line (lateral median line) in the lateral direction other than the main line, which is closest over the circuit to the median line (main line) in the lateral direction drawn (set) first in step S22. Furthermore, the simplification processing unit 102 makes the coupling straight line and the lateral median line coupled to the main line included in the main line.

In step S26, the simplification processing unit 102 checks whether there is any lateral median line other than the main line over the excitation circuit. When a result of the checking indicates that there is still a lateral median line other than the main line remaining (see the YES route from step S26), the processing returns to step S25.

When a result of the checking in step S26 indicates that there is no lateral median line other than the main line remaining (see the NO route from step S26), the processing proceeds to step S27.

In steps S27 to S31 thereafter, the simplification processing unit 102 extracts a median line in the vertical direction (downward direction) relative to the excitation circuit.

In step S27, the simplification processing unit 102 extracts the median line of the circuit portion through scanning in the downward direction with the upper left position of the excitation circuit serving as the base point, on the image data on the excitation circuit loaded onto a storage area (scanning space) of the memory 12 or the like.

In step S28, the simplification processing unit 102 checks whether there is any circuit from which the median line in the vertical direction has not been extracted. When a result of this checking indicates that there is a circuit portion from which the median line has not been extracted by the scanning in the vertical direction (see the YES route from step S28), the processing proceeds to step S29. After a circuit portion from which a vertical median line in the vertical direction has not been extracted is extracted in step S29, the processing returns to step S27 in which a median line is extracted for the extracted circuit portion.

When a result of the checking in step S28 indicates that there is no circuit portion from which the median line has not been extracted by the scanning in the vertical direction (see the NO route from step S28), for example, when the median lines have been extracted by the scanning in the vertical direction in all the circuits, the processing proceeds to step S30.

In step S30, the simplification processing unit 102 couples, with a coupling straight line, a vertical median line, other than the main line, which is closest over the circuit to the median line (vertical main line) in the vertical direction drawn (set) first in step S27. The simplification processing unit 102 makes the coupling straight line and the vertical median line coupled to the vertical main line included in the vertical main line.

In step S31, the simplification processing unit 102 checks whether there is any median line in the vertical direction (vertical median line) other than the vertical main line over the excitation circuit. When a result of the checking indicates that there is still a vertical median line other than the main line remaining (see the YES route from step S31), the processing returns to step S30.

When a result of the checking in step S31 indicates that there is no vertical median line other than the vertical main line remaining (see the NO route from step S31), the processing proceeds to step S32.

In step S32, the simplification processing unit 102 uses a coupling straight line to couple the end points of the vertical main line closest to the main line over the circuit. The simplification processing unit 102 makes the coupling straight line and the vertical main line included in the main line.

Then, the processing is terminated. The main line generated by the simplification processing unit 102 is output as the median line of the excitation circuit.

Figure 31:
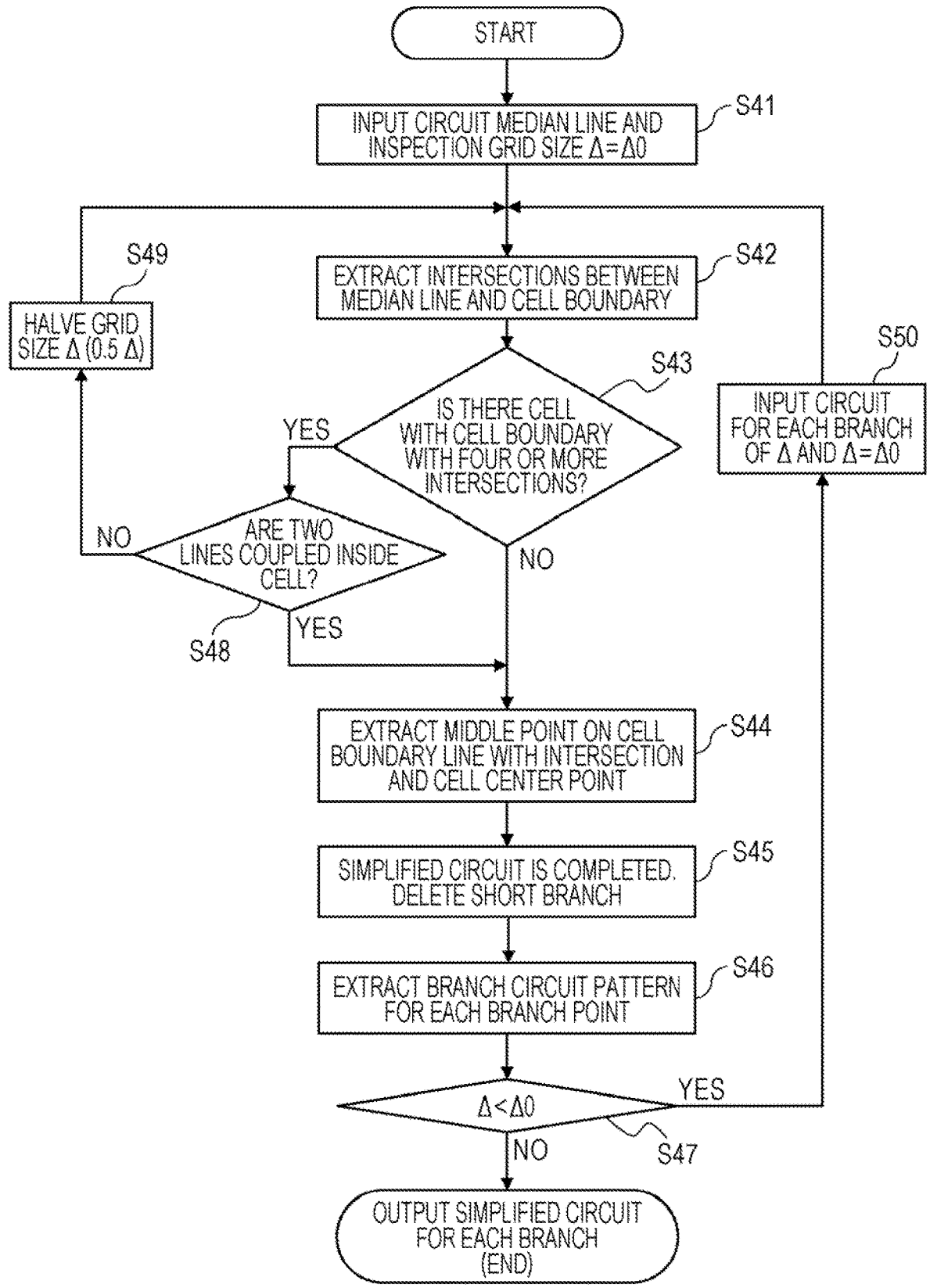
FIG. 31 is a flowchart illustrating a method of generating the simplified excitation circuit in the estimation device as an example of the embodiment.

Next, a method of generating a simplified excitation circuit in the estimation device 1 as an example of the embodiment will be described along a flowchart (steps S41 to S50) illustrated in FIG. 31.

Figure 30:
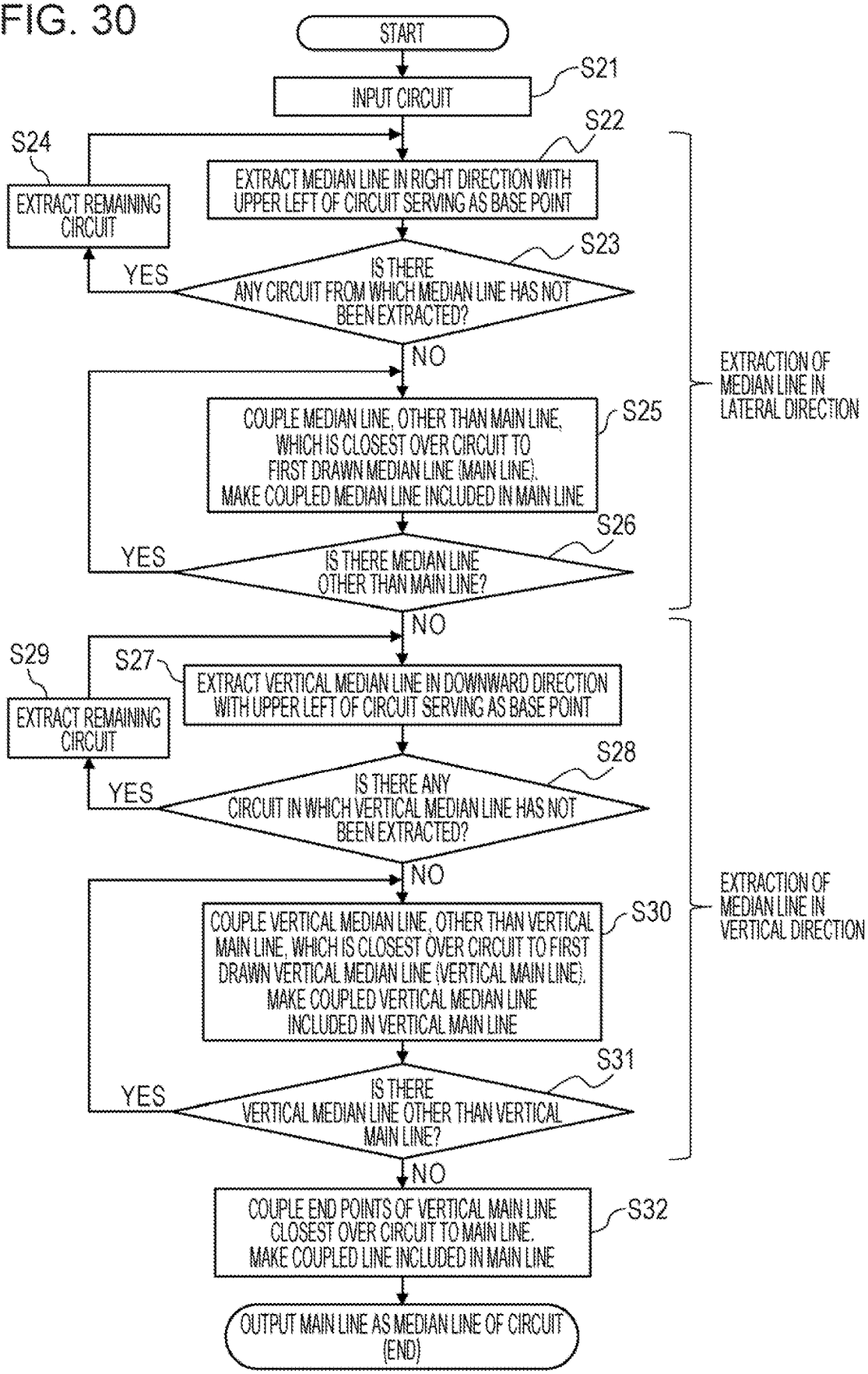
FIG. 30 is a flowchart illustrating a method of extracting the median lines of the excitation circuit performed by the simplification processing unit of the estimation device as an example of the embodiment.

In this processing, the main line (circuit median line) generated in the processing along the flowchart illustrated in FIG. 30 is used.

In step S41, the simplification processing unit 102 projects a circuit median line (main line) over the inspection grid (lattice space) that is virtually provided. An initial value Δ0 is set as a grid size Δ (Δ=Δ0). The initial value Δ0 may be, for example, set by an operator of the present estimation device 1 using the keyboard 15a via the input interface 14 in FIG. 33.

In step S42, the simplification processing unit 102 extracts an intersection between the inspection grid and the median line, for example, an intersection over a cell boundary.

In step S43, the simplification processing unit 102 checks whether there is any cell with cell boundary lines provided with four or more intersections. When a result of the checking indicates that there is a cell with the cell boundary lines with four or more intersections (see the YES route from step S43), the processing proceeds to step S48.

In step S48, the simplification processing unit 102 checks whether two median lines are coupled to each other in the cell with cell boundary lines provided with four or more intersections. When a result of the checking indicates that there are not two median lines coupled to each other in the cell (see the NO route from step S48), the processing proceeds to step S49.

In step S49, the simplification processing unit 102 halves the grid size Δ (Δ=0.5Δ). For example, the simplification processing unit 102 doubles the resolution of the cell. Then, the processing returns to step S42.

When a result of the checking in step S48 indicates that two median lines are coupled to each other in the cell with cell boundaries provided with four or more intersections (see the YES route from step S48), the processing proceeds to step S44.

When a result of the checking in step S43 indicates that there is no cell having cell boundaries provided with four or more intersections (see the NO route from step S43), the processing proceeds to step S44.

In step S44, the simplification processing unit 102 extracts a middle point over the cell boundary line with an intersection and a cell center point, in the inspection grid over which the median lines are projected.

In step S45, the simplification processing unit 102 couples the middle point over the cell boundary line extracted in step S44 and the cell center point to each other to complete the simplified excitation circuit. When a line segment (branch) configuring the simplified excitation circuit is shorter than a preset threshold, the simplification processing unit 102 excludes the branch.

In step S46, the branch circuit pattern extraction unit 103 extracts a branch circuit pattern for each branch point.

In step S47, the simplification processing unit 102 checks whether the grid size Δ is smaller than the initial value Δ0 (Δ<Δ0). When a result of the checking indicates that the grid size Δ is smaller than the initial value Δ0 (see the YES route from step S47), the processing proceeds to step S50.

In step S50, the simplification processing unit 102 inputs a circuit for each branch of Δ0. The simplification processing unit 102 projects the branch circuit pattern extracted in step S46 over the inspection grid. The initial value Δ0 is set as the grid sized (Δ=Δ0) as in step S41. Then, the processing proceeds to step S42. For example, in step S42 after the execution of step S50, instead of the circuit median line (main line), an intersection between the inspection grid and the branch circuit pattern extracted in step S46 is extracted. The extracted branch circuit pattern is thus simplified. When the extracted branch circuit is extracted over the grid of Δ<Δ0, the extracted branch circuit is re-extracted over the grid of Δ=Δ0. The extracted branch circuit may be thus simplified.

In step S42, the branch circuit is extracted with the median line provided first in the processing flow. However, when the branch circuit extraction is performed with Δ<Δ0, the processing returns via step S47, and each branch circuit extracted by the processing flow from step S42 is provided in the flow. Thus, the branch circuit extracted is mapped over the grid of Δ=Δ0, whereby the structure is simplified.

On the other hand, when a result of the checking in step S47 indicates that the grid sized is not smaller than the initial value Δ0 (see the NO route from step S47), the processing is terminated.

The simplification processing unit 102 outputs a simplified excitation circuit for each branch. Information on the simplified excitation circuit may be input to the branch circuit pattern extraction unit 103.

Figure 32:
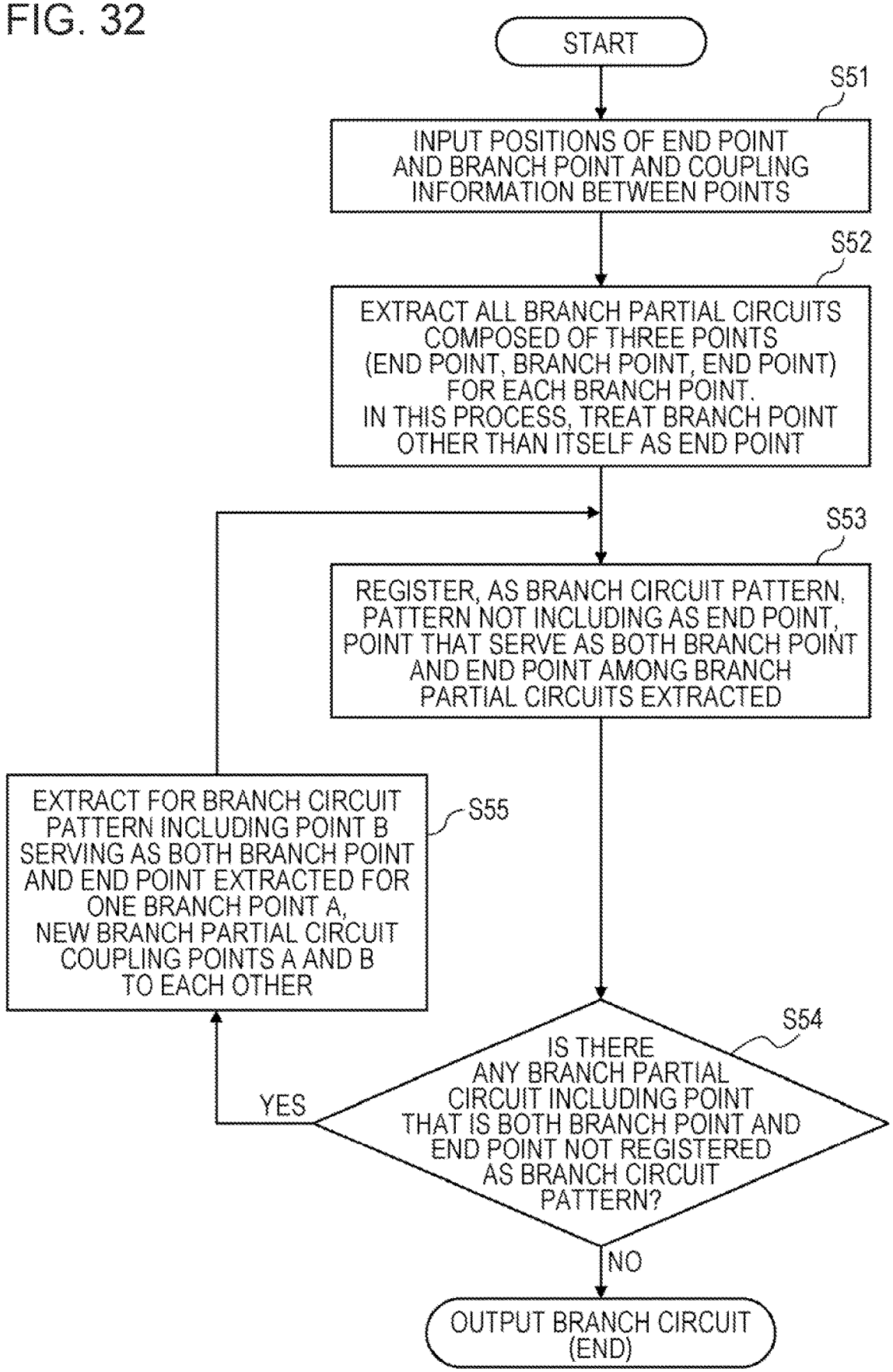
FIG. 32 is a flowchart illustrating processing executed by the branch circuit pattern extraction unit when the simplified excitation circuit in the estimation device as an example of the embodiment includes a plurality of branch points.

Next, processing executed by the branch circuit pattern extraction unit 103 when the simplified excitation circuit in the estimation device 1 as an example of the embodiment includes a plurality of branch points will be described along a flowchart illustrated in FIG. 32 (steps S51 to S55).

In step S51, the positions of the end point and the branch point in the simplified excitation circuit and coupling information indicating the coupling relationship between the end point and the branch point are input to the branch circuit pattern extraction unit 103.

In step S52, the branch circuit pattern extraction unit 103 extracts all branch partial circuits (branch circuit pattern elements) composed of three points (end point, branch point, end point) for each branch point in the simplified excitation circuit. In this case, the branch circuit pattern extraction unit 103 treats a branch point other than the focused branch point (itself) as an end point.

In step S53, among the branch partial circuits extracted, the branch circuit pattern extraction unit 103 registers, as a branch circuit pattern, a pattern not including as an end point, a point that serves as both a branch point and an end point.

In step B54, the branch circuit pattern extraction unit 103 checks whether there is any branch partial circuit (branch circuit pattern elements) that includes a point that serves as both a branch point and an end point and that is not registered as a branch circuit pattern.

When a result of the checking indicates that there is a branch partial circuit (branch circuit pattern elements) that includes a point that serves as both a branch point and an end point and that is not registered as a branch circuit pattern (see the YES route from step S54), the processing proceeds to step S55.

In step S55, the branch circuit pattern extraction unit 103 extracts for a branch circuit pattern including the point (B) serving as both a branch point and an end point extracted for one branch point (A), a new branch circuit partial circuit (branch circuit pattern elements) coupling the points (A) and (B) to each other. Then, the processing returns to step S53.

When a result of the checking in step S54 indicates that there is no branch partial circuit (branch circuit pattern elements) that includes a point that serves as both a branch point and an end point and that is not registered as a branch circuit pattern (see the NO route from step S54), the processing is terminated. The branch circuit pattern extraction unit 103 outputs a branch circuit pattern (branch circuit).

(C) Effects

As described above, with the estimation device 1 as one embodiment of the present disclosure, the excitation circuit extraction unit 101 extracts the excitation circuit that is a noise source from the analysis target circuit, and performs the radiated electromagnetic wave prediction based on this excitation circuit. According to the described embodiment, the estimation of the radiated electromagnetic waves of various electronic circuits may be achieved with a smaller amount of training data as, described above. Therefore, it is possible to reduce the amount of data on the processing target related to the radiated electromagnetic wave prediction.

The noise estimation unit 104 performs the radiated electromagnetic wave prediction (estimation of the noise intensity) using the AI for the plurality of branch circuit patterns included in the simplified excitation circuit extracted from the analysis target circuit, and implements the radiated electromagnetic wave prediction on the analysis target circuit by obtaining the MAX value of the noise intensity of the plurality of branch circuit patterns.

Accordingly, it is possible to implement the radiated electromagnetic wave prediction on the analysis target circuit with processing with a low calculation load based on the branch circuit pattern. Therefore, the processing time for the radiated electromagnetic wave prediction may be shortened, and the load of the present estimation device 1 may be reduced. For example, it is possible to reduce the prediction processing cost for the electromagnetic wave prediction on the electronic circuit board.

With the simplification processing unit 102 generating the simplified excitation circuit as a result of simplifying the configuration of the excitation circuit, the branch circuit pattern extraction unit 103 may extract the branch circuit pattern based on the simplified excitation circuit with a low load.

The simplification processing unit 102 obtains the schematic shape of the excitation circuit by extracting the median line of the excitation circuit. The excitation circuit may be thus easily simplified with a low load. The simplification processing unit 102 generates the simplified excitation circuit by projecting the median line of the excitation circuit over an inspection grid, and coupling points (the middle points over the cell boundary lines and the center points of the cells), extracted based on the intersections between the schematic shape and the square cells, to each other. Also with this configuration, the simplified excitation circuit may be easily manufactured with a low load.

The simplified excitation circuit may be generated easily with a low load, also by the simplification processing unit 102 excluding a portion having a line length that is equal to or shorter than a threshold in the simplified excitation circuit.

(D) Others

FIG. 33 is a diagram exemplifying a hardware configuration of the estimation device 1 as an example of the embodiment.

The estimation device 1 includes, for example, a processor 11, a random-access memory (RAM) 12, an HDD 13, a graphic processing device 14, an input interface 15, an optical drive device 16, a device coupling interface 17, and a network interface 18 as constituent components. These constituent components 11 to 18 may communicate with each other via a bus 19.

The processor (processing unit) 11 controls the entirety of the estimation device 1. The processor 11 may be a multi-processor. For example, the processor 11 may be any one of a CPU, a microprocessor unit (MPU), a digital signal processor (DSP), an application-specific integrated circuit (ASIC), a programmable logic device (PLD), and a field-programmable gate array (FPGA). The processor 11 may be a combination of two or more elements of the CPU, the MPU, the DSP, the ASIC, the PLD, and the FPGA. The processor 11 may function as the control unit 10 illustrated in FIG. 1.

The memory 12 is a storage memory including a read-only memory (ROM) and a RAM. The RAM of the memory 12 is used as a main storage device of the estimation device 1. At least some of operating system (OS) programs and application programs, which are executed by the processor 11, are temporarily stored in the RAM. In the RAM, various types of data to be used in the processing by the processor 11 are stored. The application programs may include a radiated electromagnetic wave estimation program executed by the processor 11 in order to achieve the radiated electromagnetic wave estimation function of the present embodiment by the estimation device 1. The memory 12 may function as the storage unit 20 illustrated in FIG. 1.

The storage device 13 is a hard disk drive (HDD), a solid-state drive (SSD), a storage class memory (SCM), or the like and stores various data. The storage device 13 is used as an auxiliary storage device of the estimation device 1. The storage device 13 stores OS programs, control programs, an application 102, and various types of data. As the auxiliary storage device, a semiconductor storage device, such as the SCM or a flash memory, may be used. The storage device 13 may function as the storage unit 20 illustrated in FIG. 1.

The monitor 14a is coupled to the graphic processing device 14. The graphic processing device 14 displays an image over a screen of the monitor 14a in accordance with an instruction from the processor 11. Examples of the monitor 14a are a display device with a cathode ray tube (CRT) and a liquid display device.

The keyboard 15a and the mouse 15b are coupled to the input interface 15. The input interface 15 transmits signals transmitted from the keyboard 15a and the mouse 15b to the processor 11. The mouse 15b is an example of a pointing device. Another pointing device may be used. Examples of the other pointing device are a touch panel, a tablet, a touch pad, and a track ball.

The optical drive device 16 reads data recorded in an optical disc 16a using laser light or the like. The optical disc 16a is a portable non-transitory recording medium in which data is recorded so that the data is readable using light reflection. Examples of the optical disc 16a are a digital versatile disc (DVD), a DVD-RAM, a compact disc read-only memory (CD-ROM), a CD-recordable (R), and a CD-rewritable (RW).

The device coupling interface 17 is a communication interface for coupling peripheral devices to the estimation device 1. For example, the device coupling interface 17 may couple a memory device 17a and a memory reader-writer 17b. The memory device 17a is a non-transitory recording medium having a function of communicating with the device coupling interface 17 and is, for example, a Universal Serial Bus (USB) memory. The memory reader-writer 17b writes data to or reads data from a memory card 17c. The memory card 17c is a card-type non-transitory recording medium.

The network interface 18 is coupled to a network (not illustrated). The network interface 18 transmits and receives data to and from other computers or communication devices via the network.

In the estimation device 1 having the hardware configuration described above, the processor 11 executes the radiated electromagnetic wave estimation program, so that functions as the circuit conversion unit 100 (the excitation circuit extraction unit 101, the simplification processing unit 102, the branch circuit pattern extraction unit 103) and the noise estimation unit 104 described above are achieved.

The program (radiated electromagnetic wave prediction program) for achieving the functions as the circuit conversion unit 100 (the excitation circuit extraction unit 101, the simplification processing unit 102, the branch circuit pattern extraction unit 103) and the noise estimation unit 104 is provided in a form of being recorded in computer-readable recording media 16a and 17a such as a flexible disk, a CD (CD-ROM, CD-R, CD-RW, or the like), a DVD (DVD-ROM, DVD-RAM, DVD-R, DVD+R, DVD-RW, DVD+RW, HD DVD, or the like), a Blu-ray disk, a magnetic disc, an optical disc, a magneto-optical disc, and a USB memory, for example. The computer reads the program from the recording medium via the optical drive device 16 or the device coupling interface 17, and transfers and stores the program to the memory 12 as an internal storage device or the storage device 13 as an external storage device for use. The program may be, for example, recorded in a storage device (recording medium) such as a magnetic disc, an optical disc, or a magneto-optical disc (not illustrated), and may be provided from the storage device to the computer via the communication path and the network interface 18.

When achieving the functions as the circuit conversion unit 100 (the excitation circuit extraction unit 101, the simplification processing unit 102, the branch circuit pattern extraction unit 103) and the noise estimation unit 104, the program stored in the internal storage device (the RAM or the ROM of the memory 12 in the present embodiment) is executed by the microprocessor (the processor 11 in the present embodiment) of the computer. At this time, the computer may read and execute the program recorded in the recording medium.

The circuit data 21, the excitation circuit data 22, and the branch circuit pattern data 23 described above are stored in the RAM 12. The circuit data 21, the excitation circuit data 22, and the branch circuit pattern data 23 may be stored in the storage device 13.

The disclosed technique is not limited to the above-described embodiment but may be carried out with various modifications without departing from the gist of the present embodiment. Each of the configurations and processing described in the embodiment may be selected or omitted as appropriate or may be appropriately combined with another one or more of the configurations and processing described in the embodiment.

The storage unit 20 may be coupled via a network as an external device of the estimation device 1.

The foregoing disclosure enables a person skilled in the art to implement and manufacture the embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable storage medium having stored a radiated electromagnetic wave estimation program causing a computer to execute a process comprising:
converting a circuit diagram of an electronic circuit board into a combination of a plurality of partial circuits; and
predicting, with a machine learning model, radiated electromagnetic waves from the electronic circuit board by using a prediction result of a radiated electromagnetic wave for each of the partial circuits obtained by the converting, wherein
in the predicting, the radiated electromagnetic waves from the electronic circuit board is predicted by obtaining a maximum value, for each frequency, in a plurality of the prediction results of the radiated electromagnetic waves for the partial circuits,
the predicting is performed on an excitation circuit in the circuit diagram of the electronic circuit board, the excitation circuit being coupled to an excitation source, and
the process further comprising:
simplifying a shape of the excitation circuit to generate a simplified excitation circuit having end points and branch points, and extracting, from the simplified excitation circuit, a partial circuit having two end points and at least one branch point between the two end points; and
training the machine learning model with training data of the simplified shape, wherein in the simplifying, wherein
the simplified excitation circuit is generated by projecting a schematic shape of the excitation circuit over a grid in which a plurality of square cells are arranged, and coupling points extracted based on intersections between the schematic shape and the square cells, and
wherein the process further comprises:
extracting a median line from each of a plurality of circuit portions included in the excitation circuit; and generating the schematic shape of the excitation circuit by repeatedly performing processing of coupling to a first median line among a plurality of the median lines extracted, an end portion of a second median line closest to the first median line via a coupling straight line, and processing of making the coupling straight line and the second median line included in the first median line.

2. The storage medium according to claim 1, the process further comprising:
excluding a portion, in the simplified excitation circuit, having a line length that is equal to or less than a threshold.

3. The storage medium according to claim 1, the process further comprising:
identifying, when the simplified excitation circuit includes a plurality of the branch points, for each of the plurality of branch points, two of a plurality of the end points included in the simplified excitation circuit that are coupled to each other via the branch point; and
identifying the partial circuit by combining the two end points identified for each of two branch points coupled to each other in the simplified excitation circuit.

4. A computerized method for a radiated electromagnetic wave estimation causing a computer to execute a process comprising:
converting a circuit diagram of an electronic circuit board into a combination of a plurality of partial circuits; and
predicting, with a machine learning model, radiated electromagnetic waves from the electronic circuit board by using a prediction result of a radiated electromagnetic wave for each of the partial circuits obtained by the converting, wherein
in the predicting, the radiated electromagnetic waves from the electronic circuit board is predicted by obtaining a maximum value, for each frequency, in a plurality of the prediction results of the radiated electromagnetic waves for the partial circuits,
the predicting is performed on an excitation circuit in the circuit diagram of the electronic circuit board, the excitation circuit being coupled to an excitation source, and
the process further comprising:
simplifying a shape of the excitation circuit to generate a simplified excitation circuit having end points and branch points, and extracting, from the simplified excitation circuit, a partial circuit having two end points and at least one branch point between the two end points; and
training the machine learning model with training data of the simplified shape, wherein in the simplifying, wherein
the simplified excitation circuit is generated by projecting a schematic shape of the excitation circuit over a grid in which a plurality of square cells are arranged, and coupling points extracted based on intersections between the schematic shape and the square cells, and
wherein the process further comprises:
extracting a median line from each of a plurality of circuit portions included in the excitation circuit; and
generating the schematic shape of the excitation circuit by repeatedly performing processing of coupling to a first median line among a plurality of the median lines extracted, an end portion of a second median line closest to the first median line via a coupling straight line, and processing of making the coupling straight line and the second median line included in the first median line.

* * * * *